(12) United States Patent
Narasimhan et al.

(10) Patent No.: US 7,262,131 B2
(45) Date of Patent: Aug. 28, 2007

(54) DIELECTRIC BARRIER LAYER FILMS

(75) Inventors: Mukundan Narasimhan, San Jose, CA (US); Peter Brooks, Los Altos, CA (US); Richard E. Demaray, Portola Valley, CA (US)

(73) Assignee: Symmorphix, Inc., Sunnyvale, CA (US)

(*) Notice: Subject to any disclaimer, the term of this patent is extended or adjusted under 35 U.S.C. 154(b) by 7 days.

(21) Appl. No.: 11/228,805

(22) Filed: Sep. 16, 2005

(65) Prior Publication Data

US 2006/0071592 A1   Apr. 6, 2006

Related U.S. Application Data

(62) Division of application No. 10/789,953, filed on Feb. 26, 2004.

(60) Provisional application No. 60/506,128, filed on Sep. 25, 2003, provisional application No. 60/451,178, filed on Feb. 27, 2003.

(51) Int. Cl.
*H01L 21/285* (2006.01)

(52) U.S. Cl. ............... 438/643; 438/627; 438/958; 257/E21.17

(58) Field of Classification Search ............... None
See application file for complete search history.

(56) References Cited

U.S. PATENT DOCUMENTS

| | | | |
|---|---|---|---|
| 3,309,302 A | 3/1967 | Heil | |
| 3,616,403 A | 10/1971 | Collins et al. | |
| 3,850,604 A | 11/1974 | Klein | |
| 4,082,569 A | 4/1978 | Evans, Jr. | |
| 4,111,523 A | 9/1978 | Kaminow et al. | |
| 4,437,966 A | 3/1984 | Hope et al. | |
| 4,587,225 A | 5/1986 | Tsukuma et al. | |
| 4,619,680 A | 10/1986 | Nourshargh et al. | |

(Continued)

FOREIGN PATENT DOCUMENTS

EP   0 510 883 A2   10/1992

(Continued)

OTHER PUBLICATIONS

Cocorullo, G. et al., "Amorphous silicon waveguides and light modulators for integrated photonics realized by low-temperature plasma-enhanced chemical-vapor deposition," *Optics Lett.* 21(24):2002-2004 (1996).

(Continued)

*Primary Examiner*—Evan Pert
*Assistant Examiner*—Victor A. Mandala, Jr.
(74) *Attorney, Agent, or Firm*—Finnegan, Henderson, Farabow, Garrett & Dunner, L.L.P.

(57) ABSTRACT

In accordance with the present invention, a dielectric barrier layer is presented. A barrier layer according to the present invention includes a densified amorphous dielectric layer deposited on a substrate by pulsed-DC, substrate biased physical vapor deposition, wherein the densified amorphous dielectric layer is a barrier layer. A method of forming a barrier layer according to the present inventions includes providing a substrate and depositing a highly densified, amorphous, dielectric material over the substrate in a pulsed-dc, biased, wide target physical vapor deposition process. Further, the process can include performing a soft-metal breath treatment on the substrate. Such barrier layers can be utilized as electrical layers, optical layers, immunological layers, or tribological layers.

24 Claims, 18 Drawing Sheets

U.S. PATENT DOCUMENTS

| | | |
|---|---|---|
| RE32,449 E | 6/1987 | Claussen |
| 4,710,940 A | 12/1987 | Sipes, Jr. |
| 4,785,459 A | 11/1988 | Baer |
| 4,915,810 A | 4/1990 | Kestigian et al. |
| 4,978,437 A | 12/1990 | Wirz |
| 5,085,904 A | 2/1992 | Deak et al. |
| 5,107,538 A | 4/1992 | Benton et al. |
| 5,110,696 A | 5/1992 | Shokoohi et al. |
| 5,119,460 A | 6/1992 | Bruce et al. |
| 5,173,271 A | 12/1992 | Chen et al. |
| 5,174,876 A | 12/1992 | Buchal et al. |
| 5,196,041 A | 3/1993 | Tumminelli et al. |
| 5,200,029 A | 4/1993 | Bruce et al. |
| 5,206,925 A | 4/1993 | Nakazawa et al. |
| 5,225,288 A | 7/1993 | Beeson et al. |
| 5,237,439 A | 8/1993 | Misono et al. |
| 5,252,194 A | 10/1993 | Demaray et al. |
| 5,287,427 A | 2/1994 | Atkins et al. |
| 5,296,089 A | 3/1994 | Chen et al. |
| 5,303,319 A | 4/1994 | Ford et al. |
| 5,306,569 A | 4/1994 | Hiraki |
| 5,309,302 A | 5/1994 | Vollmann |
| 5,338,625 A | 8/1994 | Bates et al. |
| 5,355,089 A | 10/1994 | Treger |
| 5,381,262 A | 1/1995 | Arima et al. |
| 5,427,669 A | 6/1995 | Drummond |
| 5,435,826 A | 7/1995 | Sakakibara et al. |
| 5,457,569 A | 10/1995 | Liou et al. |
| 5,472,795 A | 12/1995 | Atita |
| 5,475,528 A | 12/1995 | LaBorde |
| 5,478,456 A | 12/1995 | Humpal et al. |
| 5,483,613 A | 1/1996 | Bruce et al. |
| 5,499,207 A | 3/1996 | Miki et al. |
| 5,512,147 A | 4/1996 | Bates et al. |
| 5,538,796 A | 7/1996 | Schaffer et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,569,520 A | 10/1996 | Bates |
| 5,591,520 A | 1/1997 | Migliorini et al. |
| 5,597,660 A | 1/1997 | Bates et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates |
| 5,613,995 A | 3/1997 | Bhandarkar et al. |
| 5,645,626 A | 7/1997 | Edlund et al. |
| 5,654,054 A | 8/1997 | Tropsha et al. |
| 5,654,984 A | 8/1997 | Hershbarger et al. |
| 5,686,360 A | 11/1997 | Harvey, III et al. |
| 5,689,522 A | 11/1997 | Beach |
| 5,693,956 A | 12/1997 | Shi et al. |
| 5,702,829 A * | 12/1997 | Paidassi et al. ............. 428/610 |
| 5,718,813 A | 2/1998 | Drummond |
| 5,719,976 A | 2/1998 | Henry et al. |
| 5,731,661 A | 3/1998 | So et al. |
| 5,738,731 A | 4/1998 | Shindo et al. |
| 5,755,938 A | 5/1998 | Fukui et al. |
| 5,757,126 A | 5/1998 | Harvey, III et al. |
| 5,762,768 A | 6/1998 | Goy et al. |
| 5,771,562 A | 6/1998 | Harvey, III et al. |
| 5,792,550 A | 8/1998 | Phillips et al. |
| 5,811,177 A | 9/1998 | Shi et al. |
| 5,814,195 A | 9/1998 | Lehan et al. |
| 5,830,330 A | 11/1998 | Lantsman |
| 5,831,262 A | 11/1998 | Greywall et al. |
| 5,841,931 A | 11/1998 | Foresi et al. |
| 5,847,865 A | 12/1998 | Gopinath et al. |
| 5,849,163 A | 12/1998 | Ichikawa et al. |
| 5,853,830 A | 12/1998 | McCaulley et al. |
| 5,855,744 A | 1/1999 | Halsey et al. |
| 5,870,273 A | 2/1999 | Sogabe et al. |
| 5,882,946 A | 3/1999 | Otani |
| 5,900,057 A | 5/1999 | Buchal et al. |
| 5,909,346 A | 6/1999 | Malhotra et al. |
| 5,930,046 A | 7/1999 | Solberg et al. |
| 5,930,584 A | 7/1999 | Sun et al. |
| 5,942,089 A | 8/1999 | Sproul et al. |
| 5,948,215 A | 9/1999 | Lantsman |
| 5,952,778 A | 9/1999 | Haskal et al. |
| 5,961,682 A | 10/1999 | Lee et al. |
| 5,966,491 A | 10/1999 | DiGiovanni |
| 5,977,582 A | 11/1999 | Fleming et al. |
| 6,000,603 A | 12/1999 | Koskenmaki et al. |
| 6,001,224 A | 12/1999 | Drummond et al. |
| 6,004,660 A | 12/1999 | Topolski et al. |
| 6,024,844 A | 2/2000 | Drummond et al. |
| 6,045,626 A | 4/2000 | Yano et al. |
| 6,046,081 A | 4/2000 | Kuo |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,077,642 A | 6/2000 | Ogata et al. |
| 6,080,643 A | 6/2000 | Noguchi et al. |
| 6,093,944 A | 7/2000 | VanDover |
| 6,106,933 A | 8/2000 | Nagai et al. |
| 6,117,279 A | 9/2000 | Smolanoff et al. |
| 6,133,670 A | 10/2000 | Rodgers et al. |
| 6,146,225 A | 11/2000 | Sheats et al. |
| 6,157,765 A | 12/2000 | Bruce et al. |
| 6,162,709 A | 12/2000 | Raoux et al. |
| 6,165,566 A | 12/2000 | Tropsha |
| 6,168,884 B1 | 1/2001 | Neudecker et al. |
| 6,176,986 B1 | 1/2001 | Watanabe et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,214,660 B1 | 4/2001 | Uemoto et al. |
| 6,232,242 B1 | 5/2001 | Hata et al. |
| 6,236,793 B1 | 5/2001 | Lawrence et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,640 B1 | 6/2001 | Nam |
| 6,261,917 B1 | 7/2001 | Quek et al. |
| 6,268,695 B1 | 7/2001 | Affinito |
| 6,280,585 B1 | 8/2001 | Obinata et al. |
| 6,280,875 B1 | 8/2001 | Kwak et al. |
| 6,281,142 B1 | 8/2001 | Basceri et al. |
| 6,287,986 B1 | 9/2001 | Mihara |
| 6,290,821 B1 | 9/2001 | McLeod |
| 6,290,822 B1 | 9/2001 | Fleming et al. |
| 6,300,215 B1 | 10/2001 | Shin |
| 6,302,939 B1 | 10/2001 | Rabin et al. |
| 6,306,265 B1 | 10/2001 | Fu et al. |
| 6,344,419 B1 | 2/2002 | Forster et al. |
| 6,350,353 B2 | 2/2002 | Gopalraja et al. |
| 6,356,694 B1 | 3/2002 | Weber |
| 6,358,810 B1 | 3/2002 | Dornfest et al. |
| 6,361,662 B1 | 3/2002 | Chiba et al. |
| 6,365,300 B1 | 4/2002 | Ota et al. |
| 6,365,319 B1 | 4/2002 | Heath et al. |
| 6,376,027 B1 | 4/2002 | Lee et al. |
| 6,379,835 B1 | 4/2002 | Kucherovsky et al. |
| 6,391,166 B1 * | 5/2002 | Wang .................... 204/224 R |
| 6,409,965 B1 | 6/2002 | Nagata et al. |
| 6,413,382 B1 | 7/2002 | Wang et al. |
| 6,413,645 B1 | 7/2002 | Graff et al. |
| 6,416,598 B1 | 7/2002 | Sircar |

| | | | | | |
|---|---|---|---|---|---|
| 6,423,776 B1 | 7/2002 | Akkapeddi et al. | 2007/0053139 A1 | 3/2007 | Zhang et al. |
| 6,433,380 B2 | 8/2002 | Shin | | | |
| 6,444,750 B1 | 9/2002 | Touhsaent | | | |

FOREIGN PATENT DOCUMENTS

| | | |
|---|---|---|
| EP | 0 652 308 A2 | 10/1994 |
| EP | 0 639 655 A1 | 2/1995 |
| EP | 0 820 088 A2 | 1/1998 |
| EP | 0 867 985 B1 | 9/1998 |
| EP | 1068899 A1 | 1/2001 |
| EP | 1 092 689 A1 | 4/2001 |
| EP | 1 189 080 A2 | 3/2002 |
| JP | 2-054764 A2 | 2/1990 |
| JP | 6-010127 A | 1/1994 |
| JP | 6-100333 A | 12/1994 |
| JP | 7-224379 A | 8/1995 |
| JP | 7-233469 | 9/1995 |
| KR | 2002 26187 | 4/2002 |
| WO | WO96/23085 | 8/1996 |
| WO | WO97/35044 | 9/1997 |
| WO | WO 00/21898 A1 | 4/2000 |
| WO | WO 00/22742 A2 | 4/2000 |
| WO | WO 00/36665 A1 | 6/2000 |
| WO | WO 01/82297 A1 | 11/2001 |
| WO | WO 02/12932 A2 | 2/2002 |
| WO | WO 2004/021532 A1 | 3/2004 |
| WO | WO 2004/077519 A2 | 9/2004 |
| WO | WO 2004/106581 A2 | 12/2004 |
| WO | WO 2004/106582 A2 | 12/2004 |
| WO | WO 2006/063308 A2 | 6/2006 |

| | | |
|---|---|---|
| 6,488,822 B1 | 12/2002 | Moslehi |
| 6,497,598 B2 | 12/2002 | Affinito |
| 6,506,289 B2 | 1/2003 | Demaray et al. |
| 6,511,615 B1 | 1/2003 | Dawes et al. |
| 6,522,067 B1 | 2/2003 | Graff et al. |
| 6,533,907 B2 | 3/2003 | Demaray et al. |
| 6,537,428 B1 | 3/2003 | Xiong et al. |
| 6,558,836 B1 | 5/2003 | Whitacre et al. |
| 6,563,998 B1 | 5/2003 | Farah et al. |
| 6,570,325 B2 | 5/2003 | Graff et al. |
| 6,576,546 B2 | 6/2003 | Gilbert et al. |
| 6,602,338 B2 | 8/2003 | Chen et al. |
| 6,605,228 B1 | 8/2003 | Kawaguchi et al. |
| 6,615,614 B1 | 9/2003 | Makikawa et al. |
| 6,632,563 B1 | 10/2003 | Krasnov et al. |
| 6,673,716 B1 | 1/2004 | D'Couto et al. |
| 6,683,244 B2 | 1/2004 | Fujimori et al. |
| 6,683,749 B2 | 1/2004 | Daby et al. |
| 6,750,156 B2 * | 6/2004 | Le et al. .................... 438/785 |
| 6,760,520 B1 | 7/2004 | Medin et al. |
| 6,768,855 B1 | 7/2004 | Bakke et al. |
| 6,818,356 B1 | 11/2004 | Bates |
| 6,827,826 B2 | 12/2004 | Demaray et al. |
| 6,846,765 B2 | 1/2005 | Imamura et al. |
| 6,884,327 B2 | 4/2005 | Pan et al. |
| 2001/0027159 A1 | 10/2001 | Kaneyoshi |
| 2001/0031122 A1 | 10/2001 | Lackritz et al. |
| 2001/0034106 A1 | 10/2001 | Moise et al. |
| 2001/0041460 A1 | 11/2001 | Wiggins |
| 2002/0001746 A1 | 1/2002 | Jenson |
| 2002/0009630 A1 | 1/2002 | Gao et al. |
| 2002/0033330 A1 | 3/2002 | Demaray et al. |
| 2002/0076133 A1 | 6/2002 | Li et al. |
| 2002/0106297 A1 | 8/2002 | Ueno et al. |
| 2002/0115252 A1 | 8/2002 | Haukka et al. |
| 2002/0134671 A1 | 9/2002 | Demaray et al. |
| 2002/0140103 A1 | 10/2002 | Kloster et al. |
| 2002/0170821 A1 | 11/2002 | Sandlin et al. |
| 2003/0019326 A1 | 1/2003 | Han et al. |
| 2003/0022487 A1 | 1/2003 | Yoon et al. |
| 2003/0035906 A1 | 2/2003 | Memarian et al. |
| 2003/0042131 A1 | 3/2003 | Johnson |
| 2003/0063883 A1 | 4/2003 | Demaray et al. |
| 2003/0077914 A1 * | 4/2003 | Le et al. .................... 438/763 |
| 2003/0079838 A1 | 5/2003 | Brcka |
| 2003/0097858 A1 | 5/2003 | Strohhofer et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178637 A1 | 9/2003 | Chen et al. |
| 2003/0185266 A1 | 10/2003 | Henrichs |
| 2004/0043557 A1 | 3/2004 | Haukka et al. |
| 2004/0077161 A1 | 4/2004 | Chen et al. |
| 2004/0105644 A1 | 6/2004 | Dawes |
| 2004/0245561 A1 | 12/2004 | Sakashita et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 * | 3/2005 | Zhang et al. ............... 438/788 |
| 2005/0183946 A1 | 8/2005 | Pan et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0071592 A1 | 4/2006 | Narasimhan et al. |
| 2006/0134522 A1 | 6/2006 | Zhang et al. |

OTHER PUBLICATIONS

Kelly, P.J. et al., "A novel technique for the deposition of aluminum-doped zinc oxide films," Thin Solid Films 426(1-2):111-116 (2003).

Tomaszewski, H. et al., "Yttria-stabilized zirconia thin films grown by reactive r.f. magnetron sputtering," Thin Solid Films 287:104-109 (1996).

Final Office Action issued on Dec. 14, 2005 in U.S. Appl. No. 10/291,179.

Response to Final Office Action mailed Apr. 14, 2006, in U.S. Appl. No. 10/291,179.

Office Action mailed Apr. 27, 2006, in U.S. Appl. No. 10/291,179.

Office Action issued Nov. 28, 2001, for US Patent No. 6,506,289.

Response to Office Action filed Feb. 20, 2002, for US Patent No. 6,506,289.

Office Action issued Apr. 17, 2002, for US Patent No. 6,506,289.

Response to Office Action filed Jul. 17, 2002, for US Patent No. 6,506,289.

Notice of Allowance mailed Aug. 6, 2002, for US Patent No. 6,506,289.

Notice of Allowance mailed Nov. 10, 2003 for US Patent No. 6,506,289.

PCT Invitation to Pay Additional Fees for PCT/US01/22750, dated Mar. 13, 2002.

PCT International Search Report for PCT/US01/22750, dated Jul. 19, 2002.

PCT Written Opinion for PCT/US01/22750, dated Jul. 23, 2002.

PCT International Preliminary Examination Report for PCT/US01/22750, dated Oct. 8, 2002.

Amendment filed on Mar. 10, 2005 in U.S. Appl. No. 09/903,081.

Response to Office Action filed Feb. 28, 2006 in U.S. Appl. No. 09/903,081.

Final Office Action mailed May 8, 2006 in U.S. Appl. No. 09/903,081.

Response to Office Action filed Feb. 17, 2006 in U.S. Appl. No. 11/100,856.

Final Office Action mailed Jun. 9, 2006 in U.S. Appl. No. 11/100,856.

Final Office Action issued on Feb. 14, 2006, in U.S. Appl. No. 10/101,863.

Response to Office Action filed Feb. 24, 2006, in U.S. Appl. No. 10/101,863.

Office Action mailed Mar. 22, 2006, in U.S. Appl. No. 10/101,863.

Response to Office Action filed Jun.12, 2006, in U.S. Appl. No. 10/101,863.
Response to Office Action filed on Dec. 21, 2005 in Application No. 10/954,182.
Office Action issued on Mar. 9, 2006, in U.S. Appl. No. 10/954,182.
Office Action issued on Feb. 13, 2006, in U.S. Appl. No. 10/101,341.
Response to Office Action filed on May 15, 2006, in U.S. Appl. No. 10/101,341.
Response to Office Action filed on Jan. 3, 2006 in U.S. Appl. No. 10/650,461.
Office Action issued on Mar. 23, 2006, in U.S. Appl. No. 10/650,461.
International Preliminary Examination Report mailed on Apr. 15, 2004 in PCT/US03/24809.
Response to Office Action filed Mar. 2, 2006 in U.S. Appl. No. 10/789,953.
Final Office Action issued on May 19, 2006 in U.S. Appl. No. 10/789,953.
Office Action from Singapore Patent Office in Appl. No. 200505388-9, dated Mar. 20, 2006.
Response to Office Action filed Jan. 19, 2006 in U.S. Appl. No. 10/851,542.
Office Action mailed Apr. 19, 2006 in U.S. Appl. No. 10/851,542.
PCT International Search Report and Written Opinion for Application No. PCT/US2004/014524 dated Mar. 2, 2005.
PCT International Preliminary Report on Patentability for Application No. PCT/US2004/014524, dated Dec. 8, 2005.
PCT International Search Report for Application No. PCT/US2004/014523 dated Jan. 17, 2005.
PCT Written Opinion for Application No. PCT/US2004/014523 dated Jan. 17, 2005.
PCT International Preliminary Report on Patentability for Application No. PCT/US2004/014523, dated Dec. 8, 2005.
Specification as filed Sep. 2, 2005, for U.S. Appl. No. 11/218,652.
Kim, H-K. and Yoon, Y., "Characteristics of rapid-thermal-annealed $LiCoO_2$ cathode film for an all-solid-state thin film microbattery," *J. Vac. Sci. Technol. A* 22(4):1182-1187 (2004).
Response to Office Action filed on Oct. 17, 2005 in U.S. Appl. No. 10/291,179.
Office Action issued on Nov. 28, 2005 in U.S. Appl. No. 09/903,081.
Office Action issued Sep. 21, 2005, in U.S. Appl. No. 11/100,856.
Response to Office Action filed Dec. 5, 2005, in Application No. 10/101,863.
Response to Office Action filed on Jul. 25, 2005, in Application No. 10/954,182.
Office Action issued on Oct. 25, 2005, in U.S. Appl. No. 10/954,182.
Office Action issued Aug. 8, 2005, in U.S. Appl. No. 10/101,341.
Response to Office Action filed on Nov. 8, 2005, in U.S. Appl. No. 10/101,341.
Office Action issued on Oct. 3, 2005, in U.S. Appl. No. 10/650,461.
Office Action issued on Dec. 2, 2005, in U.S. Appl. No. 10/789,953.
Response to Office Action dated Jul. 25, 2005, in U.S. Appl. No. 10/851,542.
Office Action issued on Oct. 19, 2005, in U.S. Appl. No. 10/851,542.
Dorey, R.A., "Low temperature micromoulding of functional ceramic devices," Grant summary for GR/S84156/01 for the UK Engineering and Physical Sciences Research Council, 2 pages (2004).
Howson, R.P., "The reactive sputtering of oxides and nitrides," *Pure & Appl. Chem.* 66(6):1311-1318 (1994).
Office Action issued on Aug. 4, 2005, in U.S. Appl. No. 10/101,863.
Office Action issued on Aug. 8, 2005 in U.S. Appl. No. 10/101,341.
Affinito et al., "PML/oxide/PML Barrier Layer Performance Differences Arising from Use of UV or Electron Beam Polymerization of the PML Layers," *Thin Solid Films* vol. 308-309, pp. 19-25 (1997).
Affinito et al., "Polymer-Oxide Transparent Barrier Layers," Society of Vacuum Coaters, 39th Ann. Technical Conference Proceedings, May 5-10, 1996, Philadelphia, PA, pp. 392-397 (1996).
Alder, T. et al., "High-Efficiency Fiber-to-Chip Coupling Using Low-Loss Tapered Single-Mode Fiber," *IEEE Photonics Technology Letters*, 12(8):1016-1018 (2000).

Almeida, Vilson R. et al., "Nanotaper for compact mode conversion," *Optics Letters*, 28(15):1302-1304 (2003).
Asghari et al., "ASOC-A Manufacturing Integrated Optics Technology," Part of the SPIE Conference on Integrated Optics Devices III, vol. 3620, pp. 252-262 (Jan. 1999).
Barbier et al, "Amplifying Four-Wavelength Combiner, Based on Erbium/Etterbium-Doped Waveguide Amplifiers and Integrated Splitters", *IEEE Photonics Technology Lettters*, vol. 9, pp. 315-317, 1997, 4 pages.
Barbier, Denis, "Performances and potential applications of erbium doped planar waveguide amplifiers and lasers," GeeO, pp. 58-66 (date unknown).
Beach R.J., "Theory and optimization of lens ducts," *Applied Optics*, 35:12:2005-15 (1996).
Belkind et al., "Using pulsed direct current power for reactive sputtering of $Al_2O_3$," *J. Vac. Sci. Technol.* A 17(4), pp. 1934-1940 (Jul. 1999).
Bestwick, T., "ASOC silicon integrated optics technology," Part of the SPIE Conferences on Photonics Packaging and Integration, SPIE vol. 3631, pp. 182-190 (Jan. 1999).
Borsella et al., "Structural incorporation of silver insoda-lime glass by the ion-exchange process: a photoluminescence spectroscopy study", *Applied Physics* A 71, pp. 125-132 (2000).
Byer et al., "Nonlinear Optics and Solid-state Lasers," *IEEE Journal on Selected Topics in Quantum Electronics*, vol. 6, No. 6, pp. 921-929 (Nov. 2000).
Campbell et al., "Titanium dioxide ($TiO_2$)-based gate insulators," *IBM J. Res. Develop.* 43(3), 383-391, (May 1999).
Chang, C.Y. (edited by), "ULSI Technology," The McGraw-Hill Companies, Inc., New York, 1996, Chapter 4, pp. 169-170, 226-231 (1996).
Chen et al. "Development of Supported Bifunctional Electrocatalysts for Unitized Regenerative Fuel Cells," *Journal of the Electrochemical Society*, 149(8), A1092-99, (2002).
Choi et al., "Er-Al-codoped silicate planar light waveguide-type amplifier fabricated by radio-frequency sputtering," *Optics Letters*, vol. 25, No. 4, pp. 263-265 (Feb. 15, 2000).
Cooksey et al. "Predicting Permeability & Transmission Rate for Multilayer Materials," *Foodtechnology*, vol. 53, No. 9, pp. 60-63 (Sep. 1999).
Crowder, et al., "Low-Temperature Single-Crystal Si TFT's Fabricated on Si Films Processed via Sequential Lateral Solidification," IEEE, vol. 19, No. 8 (Aug. 1998), pp. 306-308.
Delavaux et al., "Integrated optics erbium ytterbium amplifier system in 10 Gb/s fiber transmission experiment", 22nd European Conference on Optical Communication—ECOC'96, Oslo, 4 pages (1996).
Distiributed Energy Resources: Fuel Cells, Projects, http://www.eere.energy.gov/der/fuel_cells/projects.html (2003).
DuPont Teijin Films, Mylar 200 SBL 300, Product Information (2000).
Electrometals Technologies Limited, Financial Report for the year 2002, Corporate Directory, Chairman's Review, Review of Operations (2002).
E-Tek website: FAQ, Inside E-Tek, E-Tek News, Products; http://www.etek-inc.com/ (2003).
Flytzanis et al, "Nonlinear Optics in Composite Materials," E. Wolf, Progress in Optics XXIX (c) Elsevier Scince Publishers B.V., pp. 323-425 (1991).
Frazao et al., "EDFA Gain Flattening Using Long-Period Fibre Gratings Based on the Electric Arc Technique," (date unknown).
Fujii et al, "1.54 mm photoluminescence of $Er^{3+}$ doped into $SiO_2$ films containing Si nanocrystals: Evidence for energy transfer from Si nanocrystals for $Er^{3+}$", Appl. Phys. Lett. 71 (9), pp. 1198-1200 (Sep.1997).
Garcia, C. "Size Dependence of Lifetime and Absorption Cross Section of Si Nanocrystals Embedded in $SiO_2$," Appl. Phys. Lett., vol. 82, No. 10, pp. 1595-1597 (Mar. 2003).
Goossens et al., "Sensitization of $TiO_2$ with p-type semiconductor polymers," Delft Interfaculty Research Center, Delft University of Technology Laboratory of Inorganic Chemistry, The Netherlands (1998).

Greene et al., "Morphological and electrical properties of rf sputtered Y2O3-doped ZrO2 thin films," J. Vac. Sci. Tecnol., vol. 13, No. 1 (Jan./Feb. 1976), pp. 72-75.
Han, Hak-Seung et al. "Optical Gain at 1.54 □m in Erbium-Doped Silicon Nanocluster Sensitized Waveguide," Appl. Phys. Lett., vol. 79, No. 27, pp. 4568-4570 (Dec. 2001).
Hayakawa et al., "Enhanced fluorescence from $Eu^{3+}$ owing to surface plasma oscillation of silver particles in glass", Journal of Non-Crystalline Solids, vol. 259, pp. 16-22 (1999).
Hayakawa et al, "Field enhancement effect of small Ag particles on the fluorescence from $Eu^{3+}$-doped $SiO_2$ glass", Appl. Phys. Lett., vol. 74, No. 11, pp. 1513-1515 (Mar. 1999).
Hayfield, P.C.S., "Development of a New Material-Monolithic Ti4O7 Ebonix Ceramic," Royal Society Chemistry, (2002).
Hehlen et al. "Spectroscopic Properties of $Er^{3+}$—and $Yb^{3+}$-doped Soda-Lime Silicate and Aluminosilicate Glasses," Physical Review B, vol. 56, No. 15, pp. 9302-9318 (Oct. 1997).
Hehlen et al. "Uniform Upconversion in High-Concentration $Er^{3+}$-doped Soda Lime Silicate and Aluminosilicate Glasses," Optics Letters, vol. 22, No. 11, pp. 772-774 (Jun. 1997).
Horst et al., "Compact, Tunable Optical Devices in Silicon-Oxynitride Wave Guide Technology," IBM Research Division, 3 pages (1999).
Hubner, J. and Guldberg-Kjaer, S., "Planar Er-and Yb-Doped Amplifiers and Lasers," COM Technical University of Denmark, 10:sup.th European Conf. On Integrated Optics, Session WeB2, pp. 71-74 (2001).
Hwang, Man-Soo et al., "The effect of pulsed magnetron sputtering on the properties of indium tin oxide thin films," Elsevier Science B.V., p. 29-33, (2003).
Im, et al. "Controlled Super-lateral Growth of Si Films for Microstructural Manipulation and Optimization," Materials Science Program (1998), pp. 603-617.
Im, et al., "Crystalline Si Films for Integrated Active-Matrix LiquidCrystal Displays," MrS Bulletin (Mar. 1996), pp. 39-48.
Im, et al., "Single-crystal Si films for thin-film transistor devices," American Institute of Physics (1997), pp. 3434-3436.
Itoh, M. et al., "Large reduction of singlemode-fibre coupling loss in 1.5% delta planar lightwave circuits using spot-size converters," Electronics Letters, 38(2):72-74 (2002).
Jackson et al. "An Accurate Compact EDFA Model," Dept. of Electrical and Computer Engineering, University of BC (date unknown).
Janssen et al. "Photoinduced electron transfer from conjugated polymers onto nanocrystalline $TiO_2$," Eindhoven University of Technology, The Netherlands (date unknown).
Johnson, J.E. et al., "Monolithically Integrated Semiconductor Optical Amplifier and Electroabsorption Modulator with Dual-Waveguide Spot-Size Converter Input," IEEE Journal of Selected Topics in Quantum Electronics, 6(1):19-25, (2000).
Jonsson L.B. et al. "Frequency response in pulsed DC reactive sputtering processes," Thin Solid Films, vol. 365, pp. 43-48 (2000).
Kato et al., "Recent progress on PLC hybrid integration," Part of the SPIE Conference on Optoelectric Integrated Circuits III, SPIE. vol. 3631, pp. 28-36 (Jan. 1999).
Kato, Kuniharu et al., "PLC Hybrid Integration Technology and Its Application to Photonic Components," IEEE Journal of Selected Topics in Quantum Electronics, 6(1):4-13 (2000).
Kelly et al., "Reactive pulsed magnetron sputtering process for alumina films," J. Vac. Sci. Technol. A 18(6), pp. 2890-2896 (Nov. 2000).
Kelly et al., "Control of the structure and properties of aluminum oxide coatings deposited by pulsed magnetron sputtering," J. Vac. Sci. Technol. A 17(3), pp. 945-953 (May 1999).
Kik, P.G. et al. "Gain Limiting Processes in Er-doped Si Nanocrystal Waveguides in $SiO_2$," J. Appl. Phys., vol. 91, No. 1, pp. 534-536 (Jan. 1, 2002).
Kim et al. "Frequency-dependent pulsed direct current magnetron sputtering of titanium oxide films," J. Vac. Sci. Technol. A 19(2); 429-434 (Mar. 2001).
Kim et al. "Mixture Behaviour and Microwave Dielectric Properties in the Low-fired $TiO_2$-CuO System," Jpn. J. Appl. Phys., 39, 2696-2700, (2000).

Ladouceur, F. et al., "8.8 Evaluation of Results", Silica-based Buried Channel Waveguides and Devices,, Chapman & Hall, London, pp. 98-99 (1996).
Ladouceur, F. et al., "Effect of side wall roughness in buried channel waveguides," IEEE Proc., vol. 141, pp. 242-248 (Aug. 1994).
Lamb, William B., "Designing Nonfoil Containing Skins for VIP Applications," DuPont VIA Symposium Presenation, (1999).
Lamb, William et al. "Designing Non-Foil Containing Skins for Vacuum InsulationPanel (VIP) Applications," Vuoto, vol. XXVIII, No. 1-2—Gennaio-Giugno 1999, pp. 55-58 (1999).
Lange et al, "High Gain Ultra-Short Length Phosphate glass Erbium-Doped Fiber Amplifier Material", OSA Optical Fiber Communications (OFC), 3 pages (2002).
Laporta et al, "Diode-pumped cw bulk Er: Yb: glass laser", 1952 Optics Letters/vol. 16, No. 24/Dec. 15, 6 pages (1991).
Laurent-Lund, C. et al., "PECVD Grown Multiple Core Planar Waveguides with Extremely Low Interface Reflections and Losses," IEEE Photonics Technology Letters, vol. 10, No. 10, pp. 1431-1433 (Oct. 1998).
Lee et al., "Effect of size and roughness on light transmission in a S/SiO.sub.2 waveguide: Experiments and model," Department of Materials Science and Engineering, Massachusetts Institute of Technology, (Jul. 12, 2000).
Lee et al. "Effects of interfacial layer growth on the electrical characteristics of thin titanium oxide films on silicon," Applied Physics Letters, 74(21), 3143-3145, (May 1999).
Love, J.D. et al., "Quantifying Loss Minimisation in Single-Mode Fibre Tapers," Electronics Letters, 22(17):912-914, (1986).
Mardare et al. "On the structure of Titanium Oxide Thin Films," Analele Stiintifice Ale Universitatii AL. I. Cuza IASI, vol. XLV-XLVI, 201-208 (1999).
Marques, P.V.S. et al., "Planar Silica-on-Silicon Waveguide Lasers Based in Two Layer Core Devices," 10.sup.th European Conference on Integrated Optics, Session WeB2, pp. 79-82 (2001).
Meijerink et al, Luminescence of $AG^+$ in Crystalline and Glassy $SrB_4O_7$, Journal of Physics and Chemistry of Solids, vol. 54, No. 8, pp. 901-906, (1993).
Mesnaoui et al, "Spectroscopic properties of $AG^+$ ions in phospage glasses of $NaPO_3AgPO_3$ system", European Journal of Solid State and Inorganic Chemistry, vol. 29, pp. 1001-1013, 14 pages (1992).
Mitomi, O. et al., Design of a Single-Mode Tapered Waveguide for Low-Loss Chip-to-Fiber Coupling,: IEEE Journal of Quantum Electronics, 30(8):1787-1793, (1994).
Mizuno et al. "Temperature dependence of oxide decomposition on titanium surfaces in UHV," submitted to Journal of Vacuum Science and Technology, (Oct. 28, 2001).
Ohkubo et al., "Polarization-Insensitive Arrayed-Waveguide Grating Using pure Si)2 Cladding," Fifth Optoelectronics and Communication Conference (OECC 2000) Technical Digest, 2 pages (Jul. 2000).
Ohmi et al., "Rare earth metal oxides for high-K gate insulator," Tokyo Institute of Technology,(date unknown).
Ohtsuki et al., "Gain Characteristics of a high concentration $Er^{3+}$-doped phosphate glass waveguide", J. Appl. Phys. 78(6), pp. 3617-3621 (1995).
Ono et al., "Design of a Low-loss Y-branch Optical Waveguide," Fifth Optoelectronic and Communications Conference (OECC 2000) Technical Digest, 2 pages (Jul. 2000).
Padmini et al. "Realization of High Tunability Barium Strontium Titanate Thin Films by RF Magnetron Sputtering," College of Engineering, University of California, Santa Barbara. (date unknown).
Pan et al., "Planar Er3+-doped aluminosilicate waveguide amplifier with more than 10 dB gain across C-band," Optical Society of America, 3 pages (2000).
Peters et al., "Formation mechanism of silver nanocrystals made by ion irradiation of $Na^+$ —$Ag^+$ ion-exchanged sodalime silicate glass", Nuclear Instruments and Methods in Physics Research B 168, pp. 237-244 (2000).
Rajarajan, M. et al., "Numerical Study of Spot-Zise Expanders for an Efficient OEIC to SMF Coupling," IEEE Photonics Technology Letters, 10(8):1082-1084, (1998).

Ramaswamy et al., "Ion-Exchanged Glass Waveguides: A Review", *Journal of Lightwave Technology*, vol. 6, No. 6, pp. 984-1001 (1988).
Roberts et al., "The Photoluminescence of Erbium-doped Silicon Monoxide," Department of Electronics and Computer Science, 7 pages (Jun. 1996).
Sanyo Vacuum Industries Co., Ltd. Products Info, $TiO_2$, (2003). http://www.sanyovac.co.jp/Englishweb/products/ETiO2.htm.
Schermer, R. et al., "Investigation of Mesa Dielectric Waveguides,", Proceedings of the OSA Integrated Photonics Research Topical Meeting and Exhibit, Paper No. IWB3 (Jun. 2001).
Schiller et al. "PVD Coating of Plastic Webs and Sheets with High Rates on Large Areas," European Materials Research Society 1999 Spring Meeting, Jun. 1-4, 1999, Strasbourg, France (1999).
Second International Symposium of Polymer Surface Modification: Relevance to Adhesion, Preliminary Program (1999).
Seventh International Conference on $TiO_2$ Photocatalysis: Fundamentals & Applications, Toronto, Ontario, Canada, Final Program (Nov. 17-21, 2002).
Sewell, P. et al., "Rib Waveguide Spot-Size Transformers: Modal Properties," *Journal of Lightwave Technology*, 17(5):848-856, (1999).
Shaw et al. "Use of Vapor Deposited Acrlate Coatings to Improve the Barrier Properties of MetallizedFilm," Society of Vacuum Coaters 505/856-7168, 37th Annual Technical Conference Proceedings, pp. 240-244 (1994).
Shin et al. "Dielectric and Electrical Properties of Sputter Grown $(Ba,Sr)TiO_3$ Thin Films," J. Appl. Phys., vol. 86, No. 1, pp. 506-513 (Jul. 1999).
Shmulovich et al., "Recent progress in Erbium-doped waveguide amplifiers," Bell Laboratories, 3 pages (1999).
Slooff et al, "Optical properties of Erbium-doped organic polydentate cage complexes", *J. Appl. Phys.* 83, pp. 497-503 (Jan. 1998).
Smith, R.E., "Reduced Coupling Loss Using a Tapered-Rib Adiabatic-Following Fiber Coupler," *IEEE Photonics Technology Letters*, 8(8):1052-1054 (1996).
Strohhofer, et al. "Energy transfer to $Er^{3+}$in Ag ion-exchanged glass", FOM Institute for Atomic and Molecular Physics, 10 pages (date unknown).
Sugiyama et al., "Gas Permeation Through the Pinholes of Plastic Film Laminated with Aluminium Foil," Vuoto, vol. XXVIII, N. 1-2—Gennaio-Guigno (1999).
Tervonen, A., "Challenges and opportunities for integrated optics in optical networks," Part of the SPIE Conference in Integrated Optics Devices III, SPIE vol. 3620, pp. 2-11 (Jan. 1999).
Ting et al., "Study of planarized sputter-deposited $SiO_2$," J. Vac. Sci. Technol., 15(3) pp. 1105-1112 (May/Jun. 1978).
Treichel et al., "The influence of pulsed magnetron sputtering on topography and crystallinity of TiO2 films on glass," *Space and Coatings Technology*, vol. 123, pp. 268-272 (2000).
Tukamoto, H. et al., "Electronic Conductivity of $LiCoO_s$ and Its Enhancement by Magnesium Doping," J. Electrochem. Soc., vol. 44, No. 9, pp. 3164-3168 (Sep. 1997).
Van Dover, R.B. "Amorphous Lanthanide-Doped $TiO_x$ Dielectric Films," Appl. Phys. Lett., vol. 74, No. 20, pp. 3041-3043 (May 1999).
Viljanen et al, "Planar Optical Coupling Elements for Multimode Fibers with Two-Step Ion Migration Process", Applied Physics, 24, No. 1, pp. 61-63 (Jan. 1981).
Villegas et al, "Optical spectroscopy ofa soda lime glass exchanged with silver", Physics and Chemistry of Glasses 37(6), pp. 248-253 (1996).
Von Rottkay et al. "Influence of stoichiometry on electrochromic cerium-titanium oxide compounds," Lawrence Berkeley National Laboratory, UC Berkeley, CA, (date unknown).
Westlinder et al. "Simulation and Dielectric Characterization of Reactive dc Magnetron Cosputtered $(Ta_2O_5)_{1-x}(TiO_2)_x$ Thin Films," J. Vac. Sci. Technol. B, vol. 20, No. 3, pp. 855-861 (May/Jun. 2002).
Wilkes, Kenneth T. "Gas Permeation Through Vacuum Barrier Films and its Effect on VIP Thermal Performance," Vacuum Insulation Panel Symp., Baltimore, Maryland, (May 3, 1999).
Yanagawa, H. et al., "Index-and-Dimensional Taper and Its Application to Photonic Devices," *Journal of Lightwave Technology*, 10(5):587-591 (1992).
Yoshikawa, K. et al., "Spray formed aluminium alloys for sputtering targets," *Power Metallurgy*, vol. 43, No. 3 (2000).
Zhang, Hongmei et al. "High Dielectric Strength, High k $TiO_2$ Films by Pulsed DC, Reactive Sputter Deposition," (2001).
Office Action issued on Sep. 27, 2004 in U.S. Appl. No. 10/291,179.
Response to Office Action filed on Mar. 14, 2005 in U.S. Appl. No. 10/291,179.
Office Action issued on Jun. 15, 2005 in U.S. Appl. No. 10/291,179.
Office Action issued on May 2, 2002 in U.S. Patent No. 6,533,907.
Response to Office Action filed on Sep. 3, 2002 in U.S. Patent No. 6,533,907.
Office Action issued on Feb. 12, 2004 in U.S. Appl. No. 09/903,081.
Response to Office Action filed on Aug. 10, 2004 in U.S. Appl. No. 09/903,081.
Office Action issued on Sep. 10, 2004 in U.S. Appl. No. 09/903,081.
Amendment/RCE filed on Aug. 10, 2004, in U.S. Appl. No. 09/903,081.
Office Action issued on Mar. 17, 2005 in U.S. Appl. No. 09/903,081.
Response to Office Action filed on Jun. 17, 2005 in U.S. Appl. No. 09/903,081.
Office Action issued on Jul. 8, 2005 in U.S. Appl. No. 09/903,081.
Office Action issued on May 14, 2003 in U.S. Appl. No. 10/101,492.
Response to Office Action filed on Aug. 14, 2003 in U.S. Appl. No. 10/101,492.
Office Action issued on Sep. 3, 2003 in U.S. Appl. No. 10/101,492.
Response to Office Action filed on Mar. 3, 2004 in U.S. Appl. No. 10/101,492.
Office Action issued on Feb. 24, 2004 in U.S. Appl. No. 10/101,863.
Response to Office Action filed on Jul. 23, 2004 in U.S. Appl. No. 10/101,863.
Office Action issued on Oct. 6, 2004 in U.S. Appl. No. 10/101,863.
Office Action dated Jan. 13, 2005, received in U.S. Appl. No. 10/101,863.
Response to office Action filed on Jun. 10, 2005 in U.S. Appl. No. 10/101,863.
Office Action dated Mar. 25, 2005, received in Application No. 10/954,182.
Office Action issued on Oct. 22, 2003 in U.S. Appl. No. 10/101,341.
Response to Office Action filed on Feb. 23, 2004 in U.S. Appl. No. 10/101,341.
Office Action issued on Jun. 10, 2004 in U.S. Appl. No. 10/101,341.
Response to Office Action filed on Dec. 8, 2004 in U.S. Appl. No. 10/101,341.
Office Action issued on May 4, 2004 in U.S. Appl. No. 10/101,493.
International Search Report issued on Nov. 21, 2003 in PCT/US03/24809.
Office Action issued on Mar. 14, 2005 in U.S. Appl. No. 10/789,953.
International Search Report issued on Oct. 11, 2004 in PCT/US2004/005531.
Written Opinion issued on Oct. 11, 2004 in PCT/US2004/005531.
Office Action issued Mar. 24, 2005 in U.S. Appl. No. 10/851,542.
Pct international Search Report of Application No. PCT/US2004/014524 dated Mar. 2, 2005.
PCT International Search Report of Application No. PCT/US2004/014523 dated Jan. 17, 2005.
Snoeks, E. et al., "Cooperative upconversion in erbium-implanted soda-lime silicate glass optical waveguides," J. Opt. Soc. Am. B 12(8):1468-1474 (1995).
Response to Office Action filed Jul. 27, 2006, in U.S. Appl. No. 10/291,179.
Final Office Action dated Oct. 12, 2006, in U.S. Appl. No. 10,291,179.
Response to Final Office Action mailed Nov. 3, 2006, in U.S. Appl. No. 10/291,179.
Office Action dated Dec. 1, 2006, in U.S. Appl. No. 10/291,179.
Notice of Allowance issued on Oct. 8, 2002, in U.S. Patent No. 6,533,907.
Office Action mailed Sep. 6, 2006, in U.S. Appl. No. 10/101,863.
Response to Office Action filed on Aug. 9, 2006 in Application No. 10/954,182.

Office Action dated Oct. 31, 2006, in Application No. 10/954,182.

Response to Office Action filed on Dec. 6, 2006, in Application No. 10/954,182.

Response to Final Office Action filed Aug. 3, 2006, in U.S. Appl. No. 10/789,953.

Notice of Allowance mailed Oct. 23, 2006, in U.S. Appl. No. 10/789,953.

Office Action dated Sep. 22, 2006 from Korean Patent Office in Appl. No. 10-2005-7016055.

Response to Office Action mailed Nov. 8, 2006, to the Korean Patent Office in Application No. 10-2005-7016055.

Response to Office Action from Singapore Patent Office in Appl. No. 200505388-9, dated Aug. 11, 2006.

Response to Office Action filed Jul. 26, 2006 in U.S. Appl. No. 10/851,542.

Final Office Action dated Oct. 26, 2006, in U.S. Appl. No. 10/851,542.

Preliminary Amendment filed Jul. 21, 2006, in U.S. Appl. No. 11/297,057.

Supplemental Preliminary Amendment, Substitute Specification with Markings, Substitute Specification without Markings, and Replacement Drawings dated Dec. 6, 2006 in U.S. Appl. No. 11/297,057.

Continuation Application and Preliminary Amendment as-filed.

Voluntary Amendment filed Aug. 15, 2006 in TW Appl. No. 94143175.

PCT International Search Report and Written Opinion for Application No. PCT/US05/44781 dated Oct. 3, 2006.

Belkind, A. et al., "Pulsed-DC Reactive Sputtering of Dielectrics: Pulsing Parameter Effects," 43rd Annual Technical Conference Proceedings-Denver: 86-90 (Apr. 15-20, 2000).

Scholl, R., "Power Supplies for Pulsed Plasma Technologies: State-Of-The-Art And Outlook," Advances Energy Industries, Inc., pp. 1-8 (1999).

Scholl, R., "Power Systems for Reactive Sputtering of Insulating Films," Advances Energy Industries, Inc., pp. 1-8 (Aug. 2001).

Response to Office Action and Terminal Disclaimer dated Mar. 1, 2007, in U.S. Appl. No. 10/291,179.

Response to Office Action dated Feb. 6, 2007, in U.S. Appl. No. 10/101,863.

Supplemental Preliminary Amendment dated Feb. 6, 2007, in U.S. Appl. No. 11/228,834.

Supplemental Preliminary Amendment dated Feb. 6, 2007, in U.S. Appl. No. 11/191,643.

Notice of Allowance dated Feb. 21, 2007, in U.S. Appl. No. 10/789,953.

Response to Office Action dated Jan. 26, 2007, in U.S. Appl. No. 10/851,542.

Notice of Allowance dated Feb. 22, 2007, in U.S. Appl. No. 10/851,542.

Office Action dated Mar. 14, 2007, U.S. Appl. No. 10/954,182.

Supplemental Notice of Allowance dated Mar. 15, 2007, U.S. Appl. No. 10/851,542.

* cited by examiner

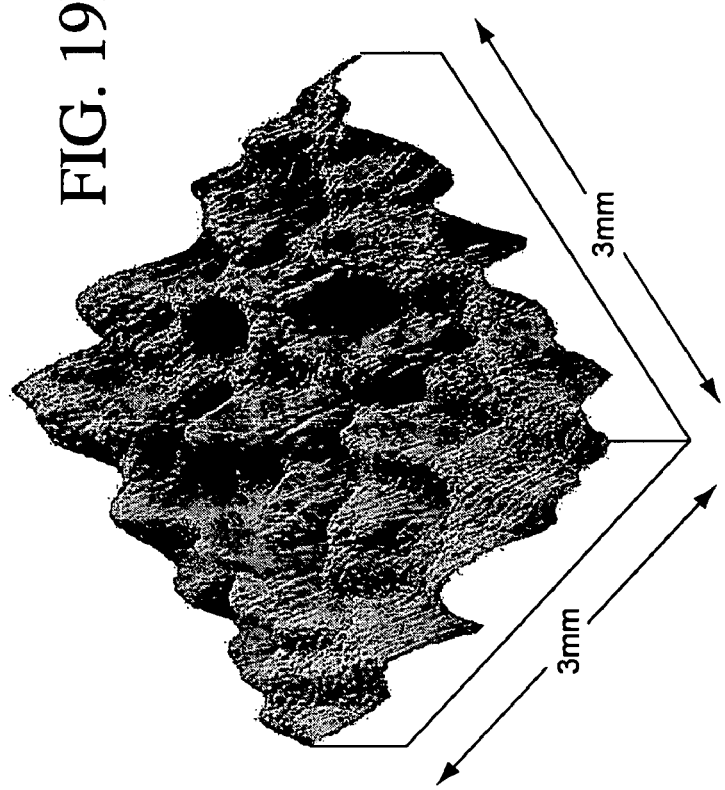
FIG. 19B
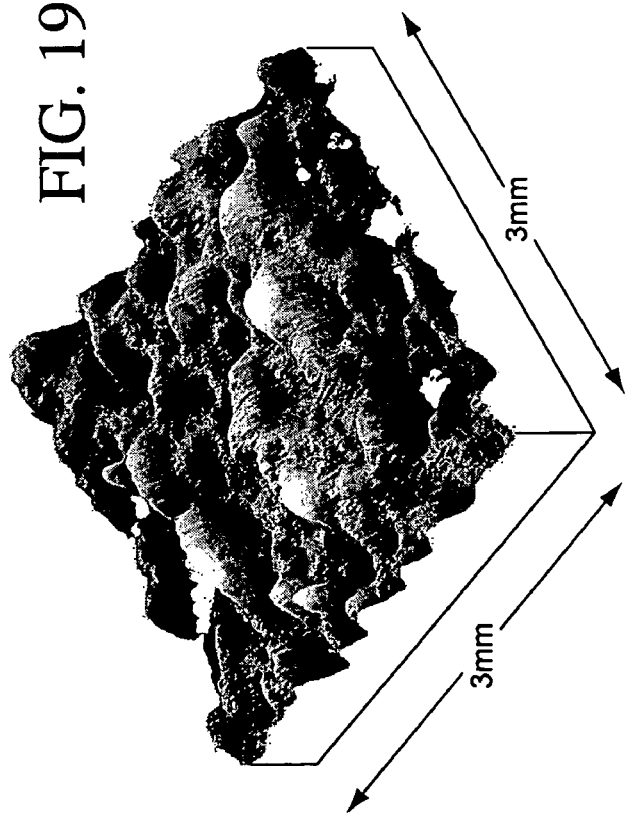
FIG. 19A
FIG. 20

DIELECTRIC BARRIER LAYER FILMS

RELATED APPLICATIONS

This is a division of application Ser. No. 10/789,953, filed Feb. 26, 2004 and claims the benefit of U.S. provisional Application No. 60/451,178, filed Feb. 27, 2003, and to U.S. provisional Application No. 60/506,128, filed Sep. 25, 2003, all of which are incorporated herein by reference.

BACKGROUND

1. Field of the Invention

The present invention is related to dielectric barrier films and, in particular, dielectric barrier films formed from high-density optical material layers for utilization in optical, electrical, tribological, and bio-implantable devices.

2. Discussion of Related Art

Dielectric barrier layers are becoming increasingly important as protective layers for organic light emitting diodes (OLEDs) and other optical or opto-electronic devices. Typically, dielectric barrier layers are deposited thin films with the appropriate electrical, physical, and optical properties to protect and enhance the operation of other devices. Dielectric barrier layers can be utilized in optical, electrical, or tribological devices. For example, touch screen displays require optically transparent protective layers to protect against transmission of atmospheric contaminants as well as to protect against physical wear.

Many thin film deposition technologies that may be utilized to form such dielectric layers include some form of ion densification or substrate bias densification. The densification process eliminates the columnar thin film structure that is typical of vacuum deposited chemical vapor (CVD) or physical vapor deposition (PVD) thin films. It is well known that such densification can be achieved by a secondary ion source arranged to "bombard" the film during deposition. See, e.g., W. Essinger "Ion sources for ion beam assisted thin film deposition," Rev. Sci. Instruments (63) 11-5217 (1992). See, also, Hrvoje Zorc, et al. Proceedings of the Society of Vacuum Coaters, 41$^{st}$ Annual Technical Conference Proceedings, 243-247, 1998, which discusses the effects of moisture exposure on wavelength shift for electron beam evaporated films (e-beams). In particular, Zorc et al. demonstrated a factor of 15 or so improvement in wavelength shift for electron beam evaporated films (e-beam) as compared to e-beam films deposited with a directed ion beam source after exposure to 30% humidity at 25° C.

D. E. Morton, et al. demonstrated wide-band dielectric pass filters comprised of alternating layers of $SiO_2$ and $TiO_2$ deposited using a "cold cathode ion source" to produce oxygen ions for the purpose of providing "moisture stable stacks of dense optical films of silicon dioxide as the low index material and either titanium dioxide, tantalum pentoxide or niobium pentoxide." D. E. Morton, et al. Proceedings of the Society of Vacuum Coaters, 41$^{st}$ annual Technical Conference, Apr. 18-23, 1998. The results described by Morton, et al., indicated that room temperature resistance to humidity up to 100% humidity was attained, as measured by the optical performance of single dielectric layers deposited on substrates mounted on a rotating platen. Optical extinction coefficients for the six samples tested in Morton, et al., varied from 0.1 to 1.6 ppt, indicating the presence of significant concentrations of defects or absorption centers in the dielectric layers. Additionally, no film thickness or film thickness uniformity data was reported by Morton, et al., for ion beam energies between 134 and 632 Volts and ion beam current up to 5 amps. Morton, et al., therefore fail to describe a film that would operate as a good barrier layer for optical devices.

Self biased physical vapor deposition, such as ion coating or activated reactive deposition, are well-known means of providing hard wear resistant coatings. However, these coatings are either deposited at several hundred Volts of bias voltage and form penetrating surface treatments with the ion flux penetrating the surface to react with the substrate material, or they are ion assisted for the purpose of decreasing the columnar structure of the film. A "filtered cathodic vacuum arc" (FCVA—reference—http://www.nanofilm-systems.com/eng/fcva technology.htm) has been used to form a dense film from an ion flux. In this case, ions are created and separated from the neutral vapor flux by a magnetic vector so that only species having a positive charge impinge the substrate. The bias voltage can be preset so that average translational energy ranges from about 50 to several hundred Volts are available. Lower ion energies are not reported due to the problem of extracting and directing a lower energy ion flux with a useful space charge density. Although quite rough due to re-sputtering at the high ion energies, hard protective layers of alumina, and other materials such as tetrahedral carbon, can be deposited with this process on cutting tools and twist drills with commercial levels of utility. Due to the limitation of the coating species to the ion flux, coating rates are low. The best or hardest carbon films are often deposited with the lowest rate of deposition, e.g., 0.3 nanometers per second on substrates up to 12" in diameter.

Transmission of a ZnO film deposited by FCVA at 600 nm wavelength is increased from about 50% at room temperature to above 80% for single films by increasing the temperature of deposition to above 230° C., with the best transmission at 600 nm of about 90% at a deposition temperature of 430° C. and a substrate bias voltage not greater than about 50 Volts. This high temperature processing indicates the use of a thermal anneal process for repair of ion-induced damage to the films. For FCVA deposition with a 200 Volt bias the transmission is much reduced. FCVA films deposited in this fashion have been shown to be polycrystalline. The defect structures exhibited in the FCVA layer are too large for formation of effective optical barrier layers. Additionally, ion sputtering of crystalline films is dependent on the crystal orientation, leading to higher surface roughness. Defect structures formed in a protective layer can degrade the optical quality of the layer and also provide paths for diffusion of atmospheric contaminations through the layer, compromising the protective properties of the layer.

Ion biased films have shown significant progress toward the goal of providing a satisfactory barrier for protection of electronic and optical films, such as, for example, photovoltaic, semiconducting and electroluminescent films. Particularly organic light emitting diodes, which utilize calcium or other very reactive metal doped electrodes and other hydroscopic or reactive materials, can be protected by such films. However, the most biased process to date, the filtered Cathodic Vacuum Arc Coating Technology or FCVAC process, is reported to produce films with a particle density greater than about 1 defect per square centimeter. It may be that the high resputtering rate at the high voltages used in this process cause surface roughening. Certainly, the presence of a particle represents a defect through which diffusion of water vapor or oxygen can proceed. Also, the roughness of the surface formed by the FCVAC process impacts the stress and morphology and also the transparency and the uniformity of the index of refraction. The resputtered film may flake from the process chamber shields or be drawn to the film surface by the large electrostatic field present in an ion beam process. In any case, the particle defect density for particles greater than the film thickness also determines pin hole density or other defects caused by discontinuous deposition of the film because line of sight films can not coat over a particle that is larger than the thickness of the film, let alone a particle many times greater in size than the thickness of the film.

In the case of ion-bias or self-bias energies exceeding several electron volts, the translational energy of the ion participating in the bias process can exceed the chemical binding energy of the film. The impacting ion, then, can either forward scatter atoms of the existing film or back sputter atoms of the existing film. Likewise, the participating ion can be adsorbed into the growing film or it can also scatter or absorb from the film surface. Sputtering of the existing film and scattering from the existing film are both favored at incoming angles of about 45° from the horizontal. In most ion coating processes, the ion beam is directed at a normal incidence to the surface to be coated. However, as noted, at ion energies exceeding the chemical threshold, and particularly at energies-exceeding 20 Volts or so, damage to the film or the substrate resulting from the ion energy in excess of the chemical binding energy is significant, and results in surface roughness, increased optical absorption characteristics, and creation of defects.

In the case of the FCVA process, roughness is an increasing function of the film thickness, increasing from about 0.2 nanometers roughness for a 50 nanometer film to about 3 nanometers for a 400 nanometer Cu film indicating substantial roughening of the polycrystalline copper surface due to differential sputtering by the self biased incoming copper ions. Such a film will scatter light, particularly at the interface between two layers of different refractive index. To date, barrier or dielectric properties of FCVA produced films have not been found.

Charging of the deposited film is also a particular problem with ion beam deposited dielectrics. To date, no low temperature dielectric and also no ion beam dielectric is known that has ever been shown to provide the electrical quality required for a transistor gate layer, for example. The ion beams embed charged ions in the film, leading to large negative flat band voltages and fields that can not be passivated at temperatures below about 450° C. The surface charge of the dielectric layer results in slow accumulation of capacitance, preventing the sharp onset of conduction in a transistor application. Consequently, no as-deposited low temperature dielectric, biased or unbiased, has been proposed for low temperature transistor applications or is known at this time.

Therefore, there is a need for high quality, dense dielectric layers for utilization as barrier layers in optical, electrical, tribological, and biomedical applications.

SUMMARY

In accordance with the present invention, one or more dielectric layers formed from layers of metal-oxide materials deposited by a pulsed, biased, wide area physical vapor deposition process are presented. A dielectric barrier layer according to the present invention can be formed from at least one highly densified metal oxide layer. Dielectric barriers according to the present invention can be highly densified, highly uniform, ultra smooth amorphous layers with ultra low concentrations of defects, providing for superior performance as protective layers against physical wear and atmospheric contamination of underlying structures as well as overlying structures that may be deposited to form an electrical, optical, or medical device. Barrier layers according to the present invention can also be self-protecting optical layers, electrical layers, or tribological layers that can be utilized actively in optical or electrical devices.

Therefore, barrier layers according to the present invention includes a densified amorphous dielectric layer-deposited on a substrate by pulsed-DC, substrate biased physical vapor deposition, wherein the densified amorphous dielectric layer is a barrier layer. Further the deposition can be performed with a wide area target. A method of forming a barrier layer according to the present inventions includes providing a substrate and depositing a highly densified, amorphous, dielectric material over the substrate in a pulsed-dc, biased, wide target physical vapor deposition process. Further, the process can include performing a soft-metal breath treatment on the substrate.

Dielectric barrier stacks can include any number of individual layers including one or more barrier layers according to the present invention. In some embodiments, the individual barrier layers can be optical layers. Typically, alternating layers of low and high index of refractory metal oxide materials can be arranged to form anti-reflective or reflective coatings in optical devices, for example. As such, dielectric barriers according to the present invention provide a protective function as well as being a functional part of an optical device. In some embodiments of the invention, for example, dielectric barriers according to the present invention can be utilized in cavity enhanced LED applications, or in formation and protection of transistor structures. Additionally, the beneficial dielectric properties of some embodiments of barrier layers according to the present invention can be utilized as electrical layers to form resistors or capacitive dielectrics.

In some embodiments, a soft metal (e.g., indium) breath treatment can be utilized before deposition of a barrier layer. Such a breath treatment is shown to significantly improve surface roughness and enhance WVTR characteristics for embodiments of barrier layers according to the present invention.

These and other embodiments of the invention are further discussed and explained below with reference to the following Figures. It is to be understood that both the foregoing general description and the following detailed description are exemplary and explanatory only and are not restrictive of the invention, as claimed. Further, specific explanations or theories regarding the deposition or performance of barrier layers or soft-metal breath treatments according to the present invention are presented for explanation only and are not to be considered limiting with respect to the scope of the present disclosure or the claims.

BRIEF DESCRIPTION OF THE DRAWINGS

FIGS. 19A and 19B illustrate the effects of the substrate on surface roughness.

FIG. 20 illustrates a barrier layer according to the present invention that further operates as a thin film gate oxide.

Figure 1A:
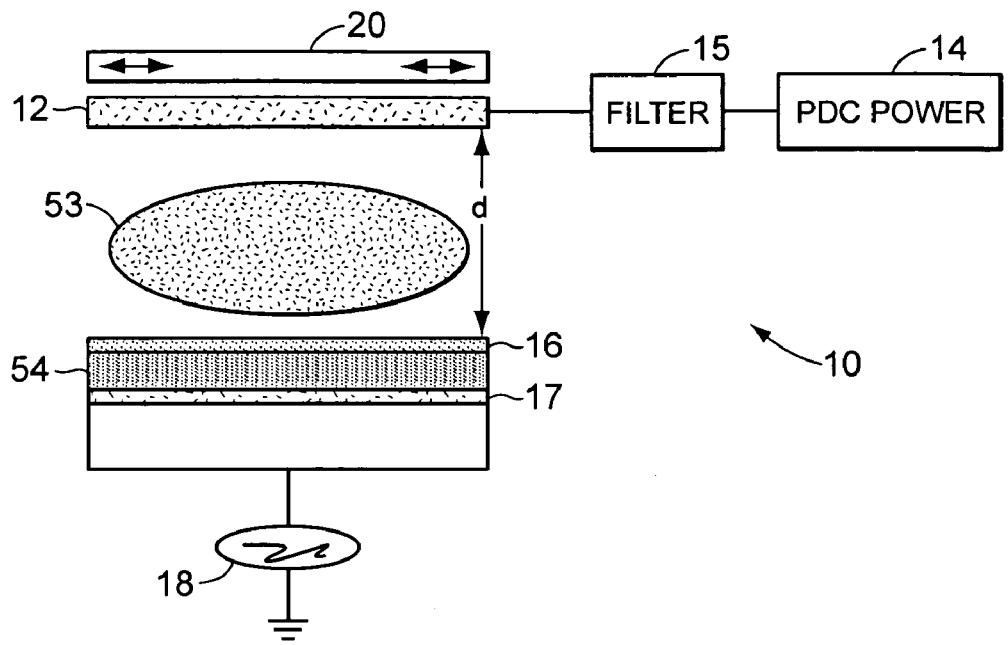
FIGS. 1A and 1B illustrate a deposition apparatus for depositing barrier layer films according to the present invention.

In the figures, elements having the same designation have the same or similar functions.

DETAILED DESCRIPTION

Barrier layers according to some embodiments of the present invention are deposited in a pulsed-dc, substrate biased, wide target physical vapor deposition process that is described further below with respect to some particular examples of such barrier layers. Some embodiments of barrier layers according to embodiments of the present invention can be characterized as highly densified, highly uniform, highly amorphous layers with particularly low defect concentrations-and high surface smoothness. Further, barrier layers according to embodiments of the present invention can have beneficial optical and electrical characteristics that allow such barrier layers to be self-protecting optical or electrical layers in optical or electrical devices formed with these layers.

For example, some embodiments of barrier layers according to the present invention can have excellent optical transparency characteristics. Further, the index of refraction of individual barrier layers is dependent on the material of deposition and therefore stacking of multiple barrier layers according to the present invention can result in highly controllable, and self protecting, reflecting or anti-reflecting coatings for optical devices. Additionally, barrier layers according to-some embodiments of the present invention can be doped with optically active impurities to form optically active layers, which are also self-protecting. For example, depositions of rare-earth ions such as Erbium or Ytterbium can result in optical amplifiers or frequency converters.

Additionally, embodiments of barrier layers according to the present invention can have highly beneficial dielectric properties and can therefore be utilized as self-protecting electrical layers. Some barrier layers according to embodiments of the present invention, for example, can be utilized as resistance layers. Other embodiments can be utilized as high-dielectric constant layers in capacitor devices. Embodiments of dielectrical barrier layers that are useful for such devices are further discussed below.

RF sputtering of oxide films is discussed in application Ser. No. 09/903,050 (the '050 application), filed on Jul. 10, 2001, by Demaray et al., entitled "Planar Optical Devices and Methods for Their Manufacture," assigned to the same assignee as is the present invention, herein incorporated by reference in its entirety. Further, targets that can be utilized in a reactor according to the present invention are discussed in U.S. application Ser. No. 10/101,341, filed on Mar. 16, 2002, assigned to the same assignee as is the present invention, herein incorporated by reference in its entirety. Methods of depositing oxides in a pulsed-dc, substrate biased, wide-target physical vapor deposition (PVD) process are further discussed in U.S. application Ser. No. 10/101863, filed on Mar. 16, 2002, (hereinafter referred to as "the pulsed, biased process") assigned to the same assignee as is the present application, herein incorporated by reference in its entirety.

Figure 1B:
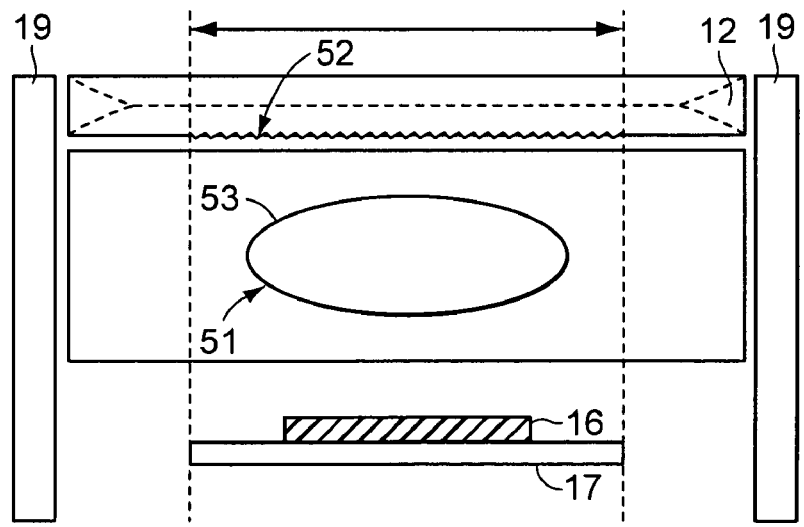

FIGS. 1A and 1B illustrate a reactor apparatus 10 for sputtering of material from a target 12 according to embodiments of the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three or four deposition chambers connected by a vacuum transport chamber. These AKT PVD reactors can be modified such that pulsed DC power is supplied to the target and RF power is supplied to the substrate during deposition of a material film.

Apparatus 10 includes a target 12 which is electrically coupled through a filter 15 to a pulsed DC power supply 14. In some embodiments, target 12 is a wide area sputter source target, which provides material to be deposited on substrate 16. Substrate 16 is positioned parallel to and opposite target 12. Target 12 functions as a cathode when power is applied to it and is equivalently termed a cathode. Application of power to target 12 creates a plasma 53 below target 12. Magnet 20 is scanned across the top of target 12. Substrate 16 is capacitively coupled to an electrode 17 through an insulator 54. Electrode 17 can be coupled to an RF power supply 18.

For pulsed reactive dc magnetron sputtering, as performed by apparatus 10, the polarity of the power supplied to target 12 by power supply 14 oscillates between negative and positive potentials. During the period of positive potential, the insulating layer on the surface of target 12 is discharged and arcing is prevented. To obtain arc free deposition, the pulsing frequency of pulsed DC power supply 14 can exceed a critical frequency that can depend, at least partly, on target material, cathode current and reverse time. High quality oxide films can be made using reactive pulse DC magnetron sputtering in apparatus 10.

Pulsed DC power supply 14 can be any pulsed DC power supply, for example an AE Pinnacle plus 10K by Advanced Energy, Inc. With this example supply, up to 10 kW of pulsed DC power can be supplied at a frequency of between 0 and 350 KHz. The reverse voltage is 10% of the negative target voltage. Utilization of other power supplies will lead to different power characteristics, frequency characteristics and reverse voltage percentages. The reverse time on this embodiment of power supply 14 can be adjusted to between 0 and 5 μs.

Filter 15 prevents the bias power from power supply 18 from coupling into pulsed DC power supply 14. In some embodiments, power supply 18 is a 2 MHz RF power supply and, for example, can be a Nova-25 power supply made by ENI, Colorado Springs, Colo. Therefore, filter 15 is a 2 MHz band rejection filter. In some embodiments, the band-width of the filter can be approximately 100 kHz. Filter 15, therefore, prevents the 2 MHz power from the bias to substrate 16 from damaging power supply 18.

However, both RF and pulsed DC deposited films are not fully dense and most likely have columnar structures. These columnar structures are detrimental for optical applications and to formation of barrier layers due to the scattering loss and pinholes caused by the structure. By applying a RF bias on wafer 16 during deposition, the deposited film can be densified by energetic ion bombardment and the columnar structure can be substantially eliminated.

In the production of some embodiments of a barrier layer according to the present invention using, for example, the AKT-1600 based system, target 12 can have an active size of about 675.70×582.48 by 4 mm in order to deposit films on substrate 16 that can have dimension about 400×500 mm. The temperature of substrate 16 can be held at between about 50 C and 500 C The distance between target 12 and substrate 16 can be between about 3 and about 9 cm. Process gas (for example, but not limited to, mixtures of Ar and $O_2$) can be inserted into the chamber of apparatus 10 at a rate up to about 200 sccm while the pressure in the chamber of apparatus 10 can be held at between about 0.7 and 6 millitorr. Magnet 20 provides a magnetic field of strength between about 400 and about 600 Gauss directed in the plane of target 12 and is moved across target 12 at a rate of less than about 20-30 sec/scan. In some embodiments utilizing the AKT 1600 reactor, magnet 20 can be a race-track shaped magnet with dimension about 150 mm by 600 mm.

Figure 1C:
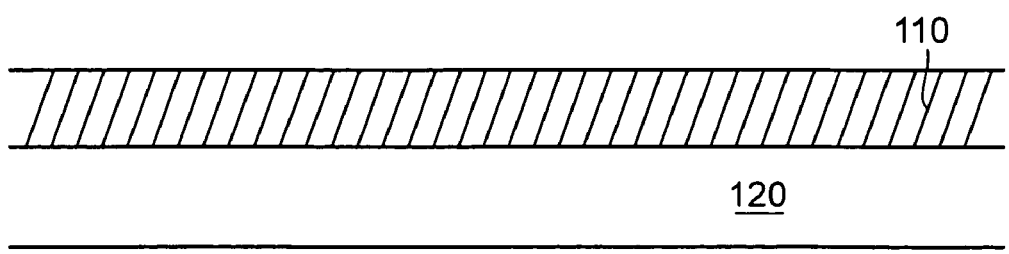
FIG. 1C illustrates a barrier layer deposited on a substrate according to embodiments of the present invention.

FIG. 1C shows a dielectric barrier layer 110 deposited on a substrate 120 according to the present invention. Substrate 120 can be any substrate, for example plastic, glass, Si-Wafers or other material. Substrate 120 may further include devices or structures that can be protected by barrier layer 110, such as organic light-emitting diode (OLED) structures, semiconductor structures, or other barrier layer structures. Barrier layer 110 can be a metallic oxide where the metal can be Al, Si, Ti, In, Sn or other metallic oxides, nitrides, halides, or other dielectrics. For example, a high index of refraction barrier layer can be formed by deposition of $TiO_2$ from a titanium target with example deposition parameters designated as 7 KW/200 W/200 KHz/60Ar/90O2/950 s (7 KW of pulsed-dc target power, 200 W of substrate bias power, 200 KHz is the pulsing frequency of the pulsed-dc target power, 60 sccm Ar gas flow, 90 sccm $O_2$ gas flow, 950 s total deposition time). Another example lower index of refraction barrier layer can be formed from a target that is 92% Al and 8% Si (i.e. 92-8 or 92/8 layers) in a process designated as 3 KW/200 W/200 KHZ/85Ar/90O2/1025 (3 KW of pulsed-dc target power, 200 W of substrate bias power, 200 KHz pulsing frequency of the pulsed-dc target power, 85 sccm Ar flow, 90 sccm $O_2$ flow for 1025 sec of deposition time). As is further discussed below, a wide range of process parameters can be utilized to deposit barrier layers according to the present invention.

Barrier layers according to the present invention can be formed from any oxide materials. For example, MgO, $Ta_2O_5$, $TiO_2$, $Ti_4O_7$, $Al_2O_3$, $SiO_2$, silicon-rich $SiO_2$, and $Y_2O_3$. Oxide compounds of Nb, Ba, Sr, and Hf can also be utilized to form barrier layers according to the present invention. Further, barrier layers can be doped with rare-earth ions to produce optically active layers. Parameters provided herein for deposition of particular layers (e.g., the $TiO_2$ layers and the 92-8 layers discussed above) are exemplary only and are not intended to be limiting. Further, individual process parameters are approximations only. A wide range of individual parameters (e.g., power levels, frequencies, gas flows, and deposition times) around those stated can be used to form barrier layers according to the present invention.

Dielectric barrier layer 110 can be characterized as a highly dense, uniform, defect free amorphous dielectric layer that may also have high optical transparency. Such films can be deposited in a pulsed-dc, substrate biased PVD process from a metallic target in an Ar/$O_2$ gas flow. As is further discussed below, some embodiments of dielectric barrier layer 110 have excellent surface roughness characteristics as well. Typically, as is discussed further below and with the examples and data provided, water vapor transmission rates for dielectric films according to embodiments of the present invention are tested in a MOCON test apparatus (MOCON referes to MOCON testing service of Minneapolis, Minn.) to be less than $1 \times 10^{-2}$ gm/m$^2$/day and are often less than $5 \times 10^{-3}$ gm/m$^2$/day.

Dielectric barrier stacks can be formed by depositing further barrier layers over barrier layer 110. Any number of stacked barrier layers can be utilized in order that the resulting structure not only function as a barrier layer, but may have other purposes in the resulting device as well. Further, a soft metallic breath treatment may be applied prior to deposition of a barrier layer according to embodiments of the present invention. A soft-metallic breath treatment refers to exposure of the substrate to a soft metallic vapor, as is further explained below.

Figure 2A:
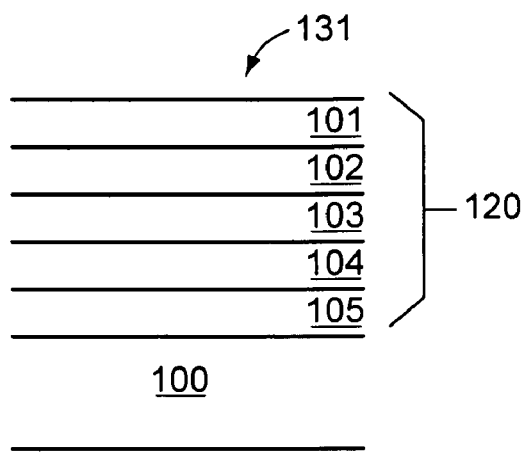
FIGS. 2A, 2B, 2C, 2D, 2E and 2F illustrate examples of devices with dielectric stacks of barrier layers according to embodiments of the present invention.
Figure 2B:
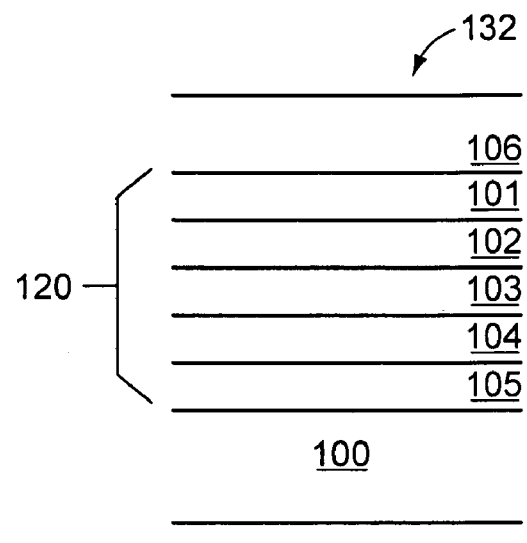
Figure 2C:
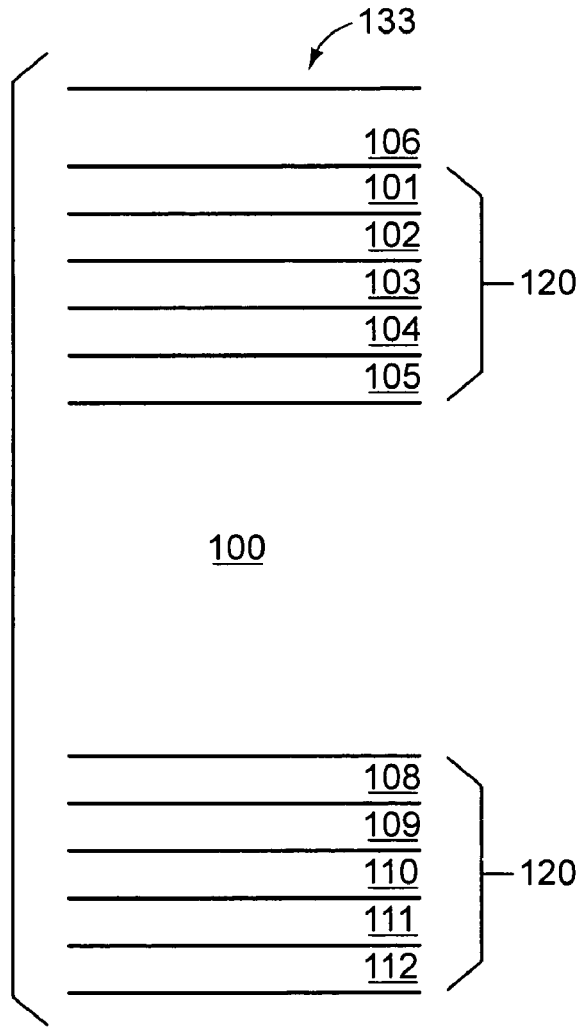
Figure 2D:
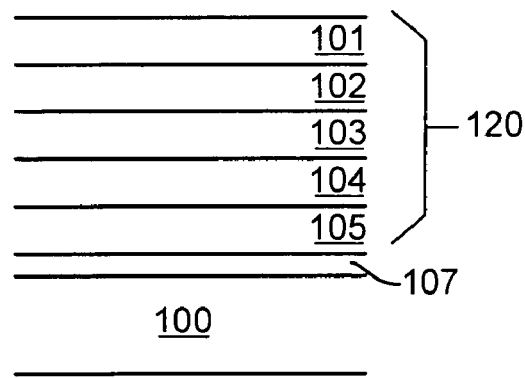

FIG. 2A shows an embodiment of a dielectric stack 120 that can be utilized as a barrier structure as well as providing further optical functions. Dielectric stack 120 includes multiple barrier layers 101, 102, 103, 104, and 105 according to embodiments of the present invention. Each of barrier layers 101, 102, 103, 104, and 105 can be deposited utilizing deposition methods as described with more detail in U.S. application Ser. No. 10/101,863. The deposition is described generally above with respect to apparatus 10. In general, dielectric stack 120 can include any number of layers. In particular, dielectric stack 120 can include only a single barrier layer. The particular example of a barrier stack 120 shown in FIG. 2A includes five layers, layers 101, 102, 103, 104 and 105. In the example of dielectric stack 120 shown in FIG. 2A, dielectric layers 101, 103 and 105 are formed of a high index material such as titania ($TiO_2$). Layers 102 and 104 can be formed of a low index material such as silica ($SiO_2$), possibly doped with alumina (e.g., 92% silica and 8% alumina by cation percents, the 92-8 layer). Barrier stack 120 can be deposited directly on a substrate 100 as shown in FIG. 2A or deposited on a layer 107 as shown in FIG. 2D. Layer 107 is a layer to be protected from atmospheric contaminants or physical damage and may include an optical or electrical device or another layer. Substrate 100 is a substrate on which layer 107 or dielectric stack 120 is formed. In some embodiments, substrate 100 can also provide a barrier to atmospheric contamination of layer 107. In some devices, further structures may be deposited over barrier layer structure 120.

Table 1 illustrates deposition parameters for some example dielectric stack structures 120 according to the present invention. As described above, each of stacks 120 illustrated in Table 1 are formed utilizing an AKT 4300 PVD system using a Biased Pulsed DC Reactive Scanning Magnetron PVD Process as further described in U.S. patent application Ser. No. 10/101,863, which has been previously incorporated by reference. Further, apparatus 10 as described above with respect to FIGS. 1A and 1B, can be clustered in the AKT 4300 PVD system with a loadlock chamber, an outgassing chamber, and may be equipped with plasma shields and a shield heater. As shown in FIG. 2A, dielectric stack 120 for these examples includes 5 layers—3 alternating layers of $TiO_2$ and 2 layers of 92-8 $SiO_2/Al_2O_3$ (92%/8% by cation concentration).

Dielectric stack 120 for each of the stacks shown in Table 1 was deposited directly on substrate 100. Substrate 100 for each of the stacks formed was first loaded into the loadlock of apparatus 10. The loadlock of apparatus 10 was pumped to a base pressure of less than about $10^{-5}$ Torr. The sheets of substrate 100, which may be of glass or plastic, was then transferred to a heat chamber of apparatus 10 and held at a temperature of about 300° C. for about 20 mins in order to outgas any moisture already accumulated by substrate 100. For polymer based substrates, for example, the pre-heat step can be eliminated or performed at a lower temperature depending on the plastic substrate used. In some cases, the substrate and shield heaters of apparatus 10 can be disabled. The substrate column of Table 1 shows the composition of substrate 100 utilized in the deposition process.

In each of stacks 1 through 6 illustrated in Table 1, the composition of the dielectric barrier layers in dielectric stack 120 is $TiO_2$/92-8/$TiO_2$/92-8/$TiO_2$, indicating that layers 101, 103 and 105 as shown in FIG. 2A are $TiO_2$ layers and layers 102 and 104 as shown in FIG. 2A are $SiO_2/Al_2O_3$ (92%/8% by cation concentration). The $TiO_2$ layers are deposited with the parameters shown in the $TiO_2$ Deposition Process column. The process details are given in the format: target power/bias power/pulsing frequency/Ar flow/$O_2$ flow/deposition time. Target power refers to the power supplied to target 12 of apparatus 10. Bias power refers to the power supplied by bias generator 18 to electrode 17 on which substrate 100 is mounted in place of substrate 16 as shown in FIG. 1A and capacitively coupled to electrode 17. The Ar and $O_2$ flow rates across substrate 100 are then described in units of standard cubic centimeter/min (sccm). Finally, the deposition time is given. For example, the $TiO_2$ layers for stack number 1 illustrate in Table 1 were deposited with a target RF power of about 7 kW, with about 200 W of bias power, pulse frequency of about 200 KHz, an Ar flow rate of about 60 sccms, an $O_2$ flow rate of about 90 sccms, and a deposition time of about 950 s. The measured thickness of a typical $TiO_2$ layer deposited according to the process described in the $TiO_2$ Deposition Process column is shown in the measured thickness $TiO_2$ column of Table 1.

Similarly, the deposition parameters for deposition of silica/alumina layers for each dielectric stack 120 shown in Table 1 are shown in the silica/alumina (92/8) deposition process column. As indicated each of the silica/alumina layers for stack numbers 1-6 shown in Table 1 are about 92% Silica and about 8% alumina by cation concentration. For example, in stack number 1 illustrated in Table 1, the silica/alumina layers were deposited with the power to target 12 being about 3 kW, the bias power to electrode 17 was about 200 W, the frequency of pulsed DC power supply 14 was about 200 kHz, the Ar flow rate was about 85 sccm, the $O_2$ flow rate was about 90 sccm, and the deposition time was about 1,005 sec.

In general, in this disclosure a dielectric barrier layer referred to as 92/8 layer refers to a barrier layer formed from continuous deposition of a dielectric barrier layer from the 92% Silica/8% Alumina target. A dielectric barrier layer referred to as a 92-8 layer refers to a barrier layer formed in steps from the 92% Silica/8% Alumina target. A 92-8 layer can be formed, for example, on plastic substrates whereas 92/8 layers can be formed on Si-wafers or glass substrates that are not so sensitive to heat.

In each of the stacks illustrated in Table 1, the reverse time for pulsed-DC power supply 14 was fixed at about 2.3 microseconds. The spacing between target 12 and substrate 100 was ~60 mm, and the, spacing between magnet 20 and target 12 was ~4-5 mm. The temperature of substrate 100 was about 200° C. and the shield heater of apparatus 10 was set to about 250° C. The home offset of magnet 20 was set to be about 20 mm and the scan length was about 980 mm. The total pressure inside the chamber of apparatus 10, in plasma 53, during deposition of the $TiO_2$ layers was about 5-6 mT. The total pressure inside the chamber, in plasma 53, during deposition of the silica/alumina layers was about 8-9 mT.

In some barrier stacks according to the present invention, barrier layers are deposited by a reactively sputtered thin film layer or layers, formed by a process as previously described in the pulsed, biased deposition process, U.S. application Ser. No. 10/101,863. The pulsed, biased deposition process combines optical quality vacuum films having uniquely dense morphologies free of the columnar defects that are typical of non-biased vacuum thin films with parts per million uniformity and control of the optical index and birefringence. Very high resolution ellipsometry also demonstrates that a wide range of film index can be deposited with extinction coefficients which are zero across the visible and in the near IR region, and uniform on the order of parts per million providing substantially perfect transparency. As a result of the high level of densification and the low defect concentration, it is demonstrated that these very transparent films also provide superior diffusion barrier protection for moisture ingress as measured by steam permeation. Lastly, the same films demonstrate much higher dielectric breakdown under high voltage stress, also a result of the low levels of defects.

Figure 8:
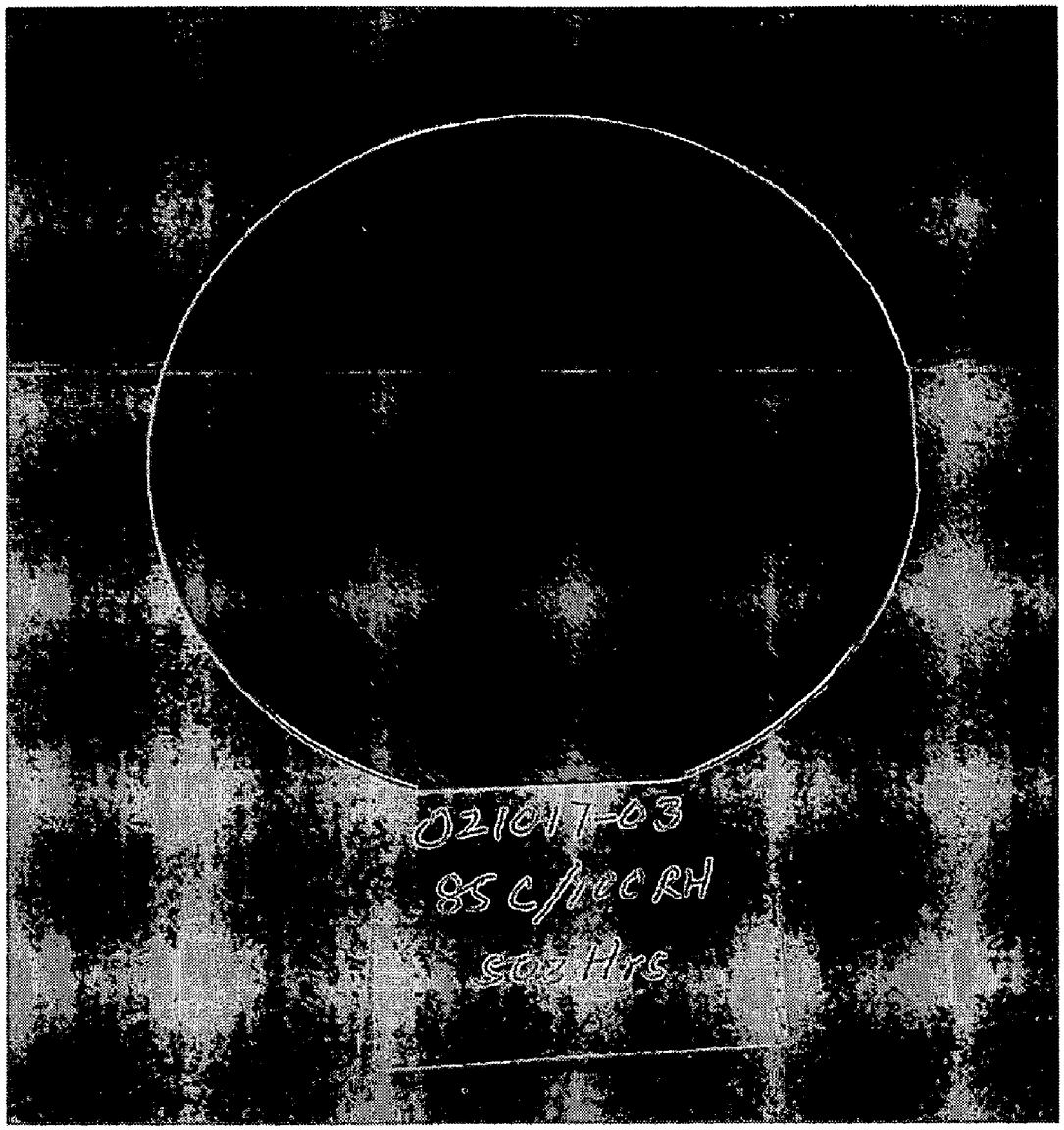
FIG. 8 shows an example $TiO_2$ barrier layer according to embodiments of the present invention deposited on a reactive aluminum layer after exposure to a high humidity, high temperature environment for an extended period of time.

FIG. 8 shows a sample after exposure to a high-humidity, high temperature environment for an extended period of time. In the sample shown in FIG. 8, about 200 nm of $TiO_2$ was deposited on a reactive aluminum layer that had been deposited on a 4" silicon wafer. The sample was kept in a chamber at about 85° C. with a relative humidity of about 100% for about 500 hours. As can be seen in FIG. 8, no defects are visible on the wafer indicating a high level of protection of the underlying reactive aluminum layer.

Figure 9:
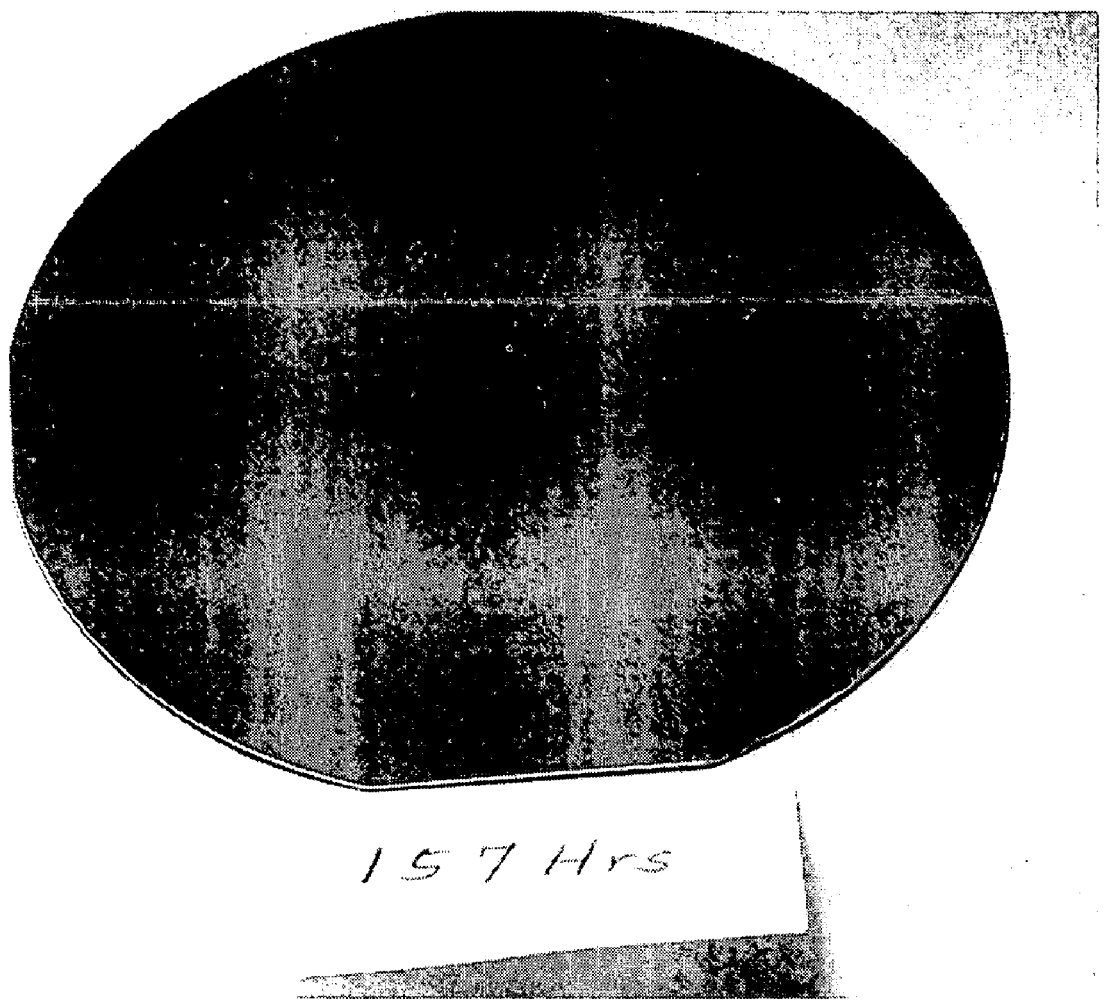
FIG. 9 shows an example silica/alumina barrier layer according to embodiments of the present invention deposited on a reactive aluminum layer after exposure to a high humidity, high temperature environment for an extended period of time.

FIG. 9 shows a sample with a silica/alumina layer according to the present invention after exposure to a high-humidity, high-temperature environment for an extended period of time. In the sample shown in FIG. 9, about 10 nm of aluminum is deposited on a 4" silicon wafer. About 100 nm of silica/alumina is deposited over the aluminum. The sample was then placed in a pressure cooker at about 250° C. with about 3.5 atm of saturated steam for about 160 hours. Again, no defects are visible on the wafer indicating a high level of protection of the underlying reactive aluminum layer. In another example, the thin reactive Al on a Si wafer was tested under the same conditions without a barrier layer and became transparent within minutes of the testing.

Selected metal oxide films deposited with the previously disclosed process, from tens of nanometers to more than 15 microns, are not only impervious to moisture and chemical penetration as a film, but can also provide protection to an underlying layer or device from the effect of gas or moisture ingress while serving as an optical, electrical and/or tribological layer or device, rendering substantial manufacturing and environmental margins to the respective layers and devices. The subject process has been demonstrated on wide area substrates of glass and metal as well as low temperature material such as plastics.

Table 4 shows Vickers Hardness (MPa) values obtained by testing an $Al_2O_3$ barrier layer and an Er-doped alumina/silicate (40% alumina/60% silica) films on a Si-Wafer. The $Al_2O_3$ barrier layer was deposited in a 3 kW/100 W/200 KHz/30Ar/44O2/t process with a 2.2 μs reverse time. The Er, Yb doped $Al_2O_3$ was deposited with the process 6 kW/100 W/120 KHz/60Ar/28O2/t process with a 1.2 μs reverse time. As can be seen in Table 4, the hardness as indicated generally by the Vickers number is large compared to conventionally deposited alumina films.

Returning to FIG. 2A, a dielectric stack 120 is deposited on substrate 100. Each of barrier layers 101, 102, 103, 104, and 105 can be optical layers (i.e., layers that are optically useful). Substrate 100 may be any glass, plastic, metallic, or semiconductor substrate. The thickness of layers 101, 102, 103, 104, and 105 of dielectric stack 120 can be varied to form either an anti-reflective coating or a reflective coating. FIG. 2B shows a transparent conducting layer 106 deposited over dielectric stack 120. Transparent conducting layer 106 can be, for example, an indium tin-oxide layer. FIG. 2C illustrates a substrate 100 with dielectric stacks 120 deposited on both a top surface and a bottom surface of substrate 100. The particular example shown in FIG. 2C includes an embodiment of dielectric stack 120 with layers 101, 102, 103, 104, and 105 deposited on a top surface of substrate 100 and another embodiment of dielectric stack 120, shown having layers 108, 109, 110, 111, and 112 in FIG. 2C, deposited on the bottom surface of substrate 100. Again, layers 108, 110, and 112 may be high index layers according to the present invention (e.g., $TiO_2$ layers) and layers 109 and 111 may be lower index layers such as silica/alumina layers. Examples of deposition parameters for dielectric stack 120 can be found in Table 1. As another example of a stack of barrier layers according to the present invention that provides good transmission characteristics is a four-layer stack $TiO_2/SiO_2/TiO_2/SiO_2$ layering of thicknesses 12.43 nm, 36.35 nm, 116.87 nm, and 90.87 nm, respectively, deposited on glass provides a high transparency in the wavelength range of about 450 nm and 650 nm.

Figure 2E:
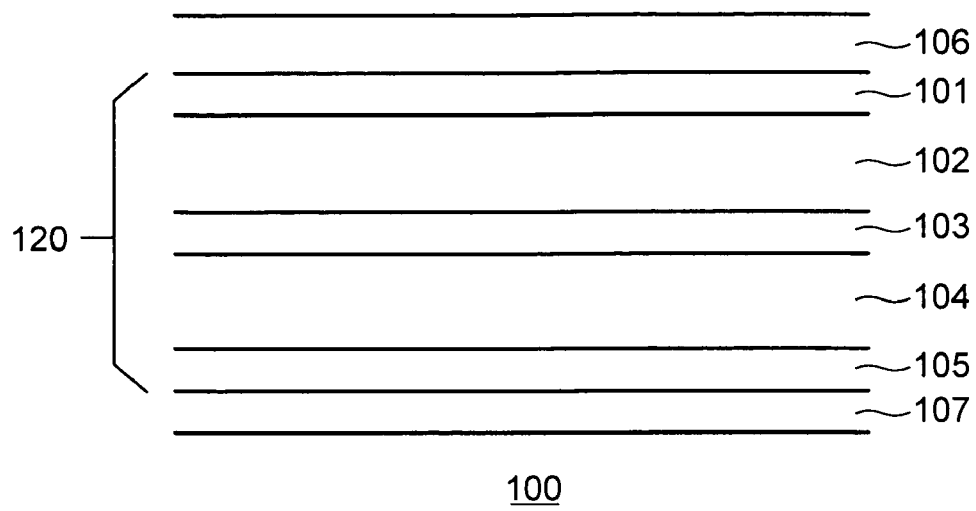
Figure 2F:
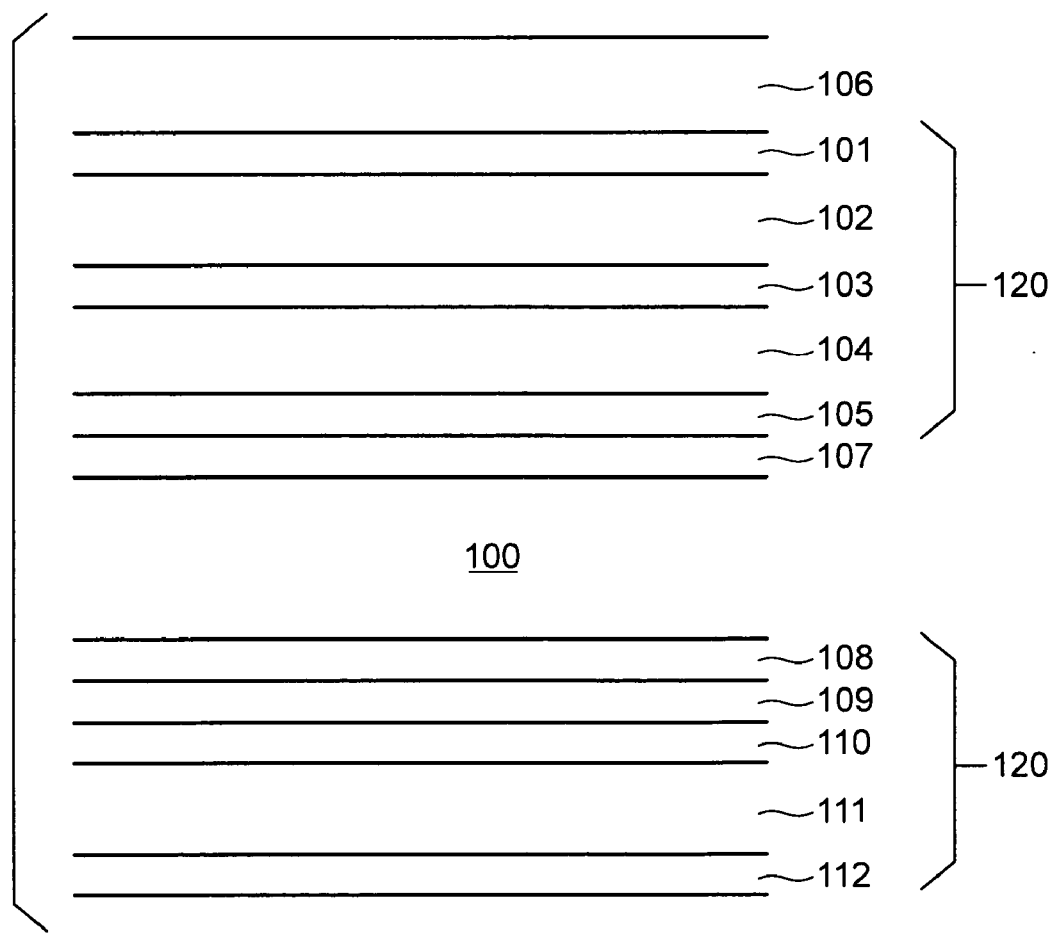

In FIG. 2D dielectric stack 120 is shown protecting a layer 107. Layer 107 is any layer of material that should be protected by a transparent barrier layer. For example, layer 107 may be a reactive metal such as aluminum, calcium or barium, layer 107 may be a fragile layer such as a conductive transparent oxide, or layer 107 may include an active optical or electrical device. As discussed above, the individual layers of dielectric stack 120 can provide protection both from incursion of atmospheric contaminants and protection against physical damage of layer 107. In some embodiments, the layer thickness of dielectric layers (e.g., layers 101, 102, 103, 104, and 105 shown in FIG. 2D) of dielectric stack 120 are arranged to form either a transparent or reflective film at particular wavelengths. One skilled in the art can determine the thickness of individual films in dielectric stack 120 to form a reflective or anti-reflective film of dielectric stack 120. In some embodiments, where layer 107 is a metal such as aluminum, barium, or calcium, the device shown in FIG. 2D forms a highly stable mirror. FIG. 2E shows a dielectric stack 120 protecting a layer 107 where layer 107 has been deposited on substrate 100. Further, a transparent conducting layer 106 has further been deposited over dielectric stack 120. FIG. 2F shows a structure where a second barrier stack 120 has been deposited on the bottom surface of substrate 100.

Figure 10:
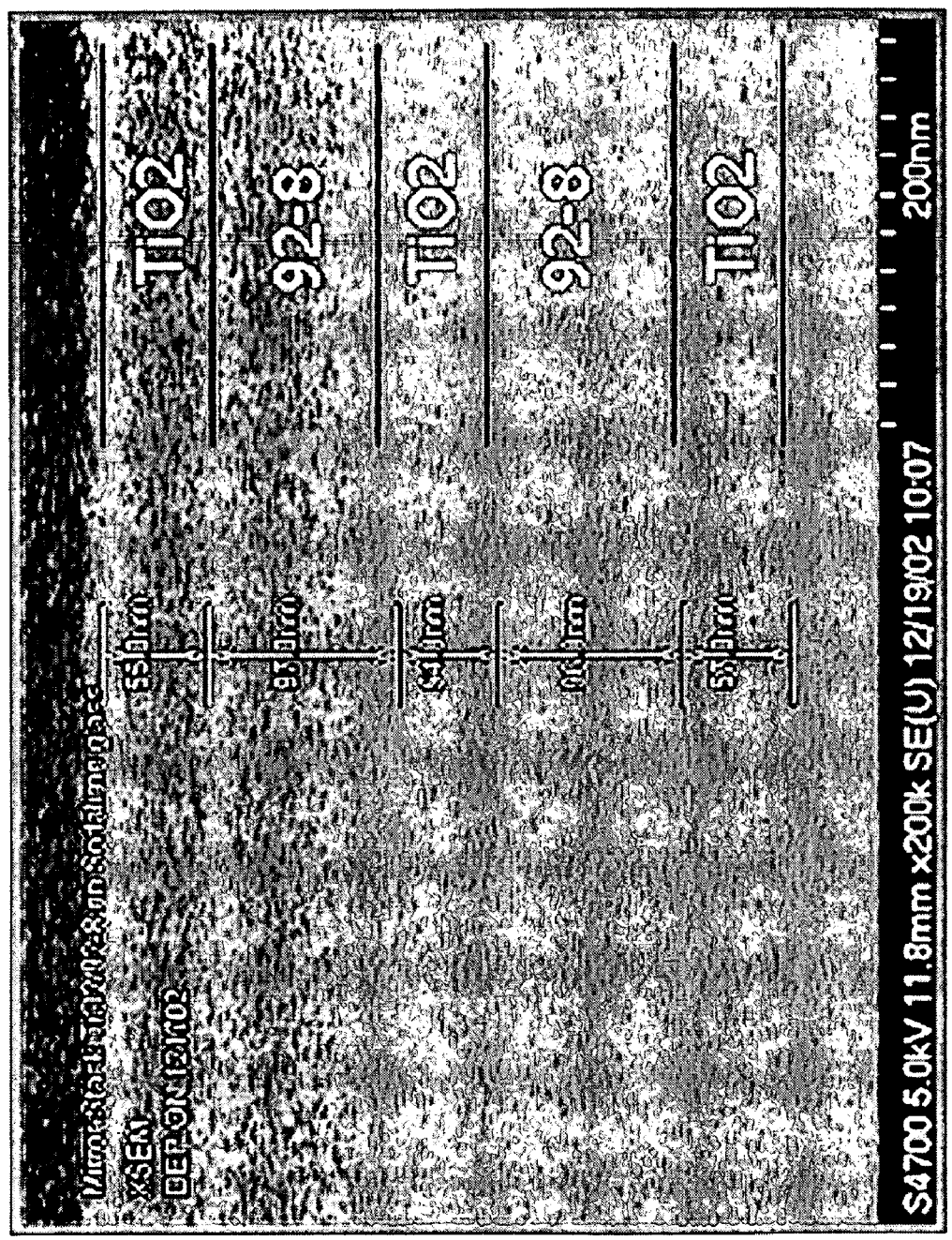
FIG. 10 shows an SEM photograph of a cross section of an embodiment of a dielectric stack of barrier layers according to embodiments of the present invention.

FIG. 10 shows a cross sectional SEM view of an example dielectric stack according to the present invention. Again, a five-layer TiO2/92-8 stack is shown with thickness 550 nm for the $TiO_2$ layers and 970 nm for the 92-8 silica/alumina. The example shown in FIG. 10 is a dielectric mirror stack such as that used to form a microcavity LED.

Although FIGS. 2A through 2F show various configurations and utilizations of a barrier stack 120 having five layers, in general, a barrier stack 120 according to the present invention may be formed of any number of barrier layers. Further, the examples of barrier layers 101, 102, 103, 104, and 105 illustrated in FIGS. 2A through 2F illustrate examples of optical layers according to the present invention where those optical layers also function as self-protecting barrier layers in that they protect themselves as well as the particular surface or device on or below which they are deposited. Additionally, one or more of barrier layers 101, 102, 103, 104, and 105 may include optically active dopant ions such as rare-earth ions in order to provide more optically active functionality. Further, in accordance with the present invention, one or more of layers 101, 102, 103, 104, and 105 may be layers other than barrier layers according to the present invention. Each of the barrier layers described with respect to FIGS. 2A through 2F can be deposited utilizing a pulsed, biased deposition process as has been described in U.S. application Ser. No. 10/101,863 to form a highly densified layer of material with very low defect concentrations.

Figure 3:
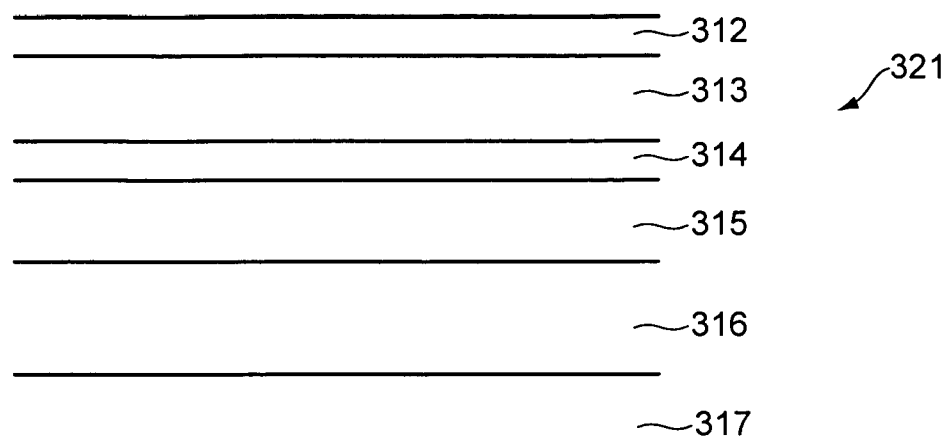
FIG. 3 shows a microcavity enhanced LED structure utilizing dielectric stacks of barrier layers according to embodiments of the present invention.

FIG. 3 shows another structure 321 utilizing dielectric stacks of barrier layers according to the present invention. As shown in FIG. 3, structure 321 includes a dielectric stack 315 deposited on a substrate 316. Substrate 316 may be formed, for example, of glass or plastic materials. A transparent conductive layer 314, such as for example indium tin oxide, is deposited on dielectric stack 315. Layer 313 can be an electroluminescence layer such as, for example, a phosphor-doped oxide or fluoride material, rare earth doped silicon rich oxide light emitting device, or an organic light emitting polymer, OLED (organic light emitting diode) or polymer stack. A metal layer 312, which may be aluminum and may be doped with calcium or barium, is deposited on the side near layer 313. A second dielectric stack 317 can be formed on the bottom of substrate 316.

Structure 321 illustrated in FIG. 3 is an example of a microcavity enhanced LED, protected from water and reactive gas which may diffuse through substrate 316 by dielectric stacks 315 and 317. When layer 312 is a metal layer, a microcavity is formed between layer 312 and dielectric stack 315. Dielectric stack 315 can out-couple light emitted from electroluminescence layer 313. Layer 313 emits light when it is electrically biased as a result of a voltage applied between transparent conducting layer 314 operating as an anode and conducting layer 312 operating as a cathode. The layers of dielectric stack 315 and dielectric stack 317 may be arranged to contain the light emitted by layer 313 between layer 317 and metallic layer 312, forming an etalon arrangement to guide light along substrate 316. Additionally, dielectric layer 317 may-be arranged to transmit light produced by layer 313, thereby forming a monitor arrangement with light being emitted substantially normal to substrate 316.

Figure 11:
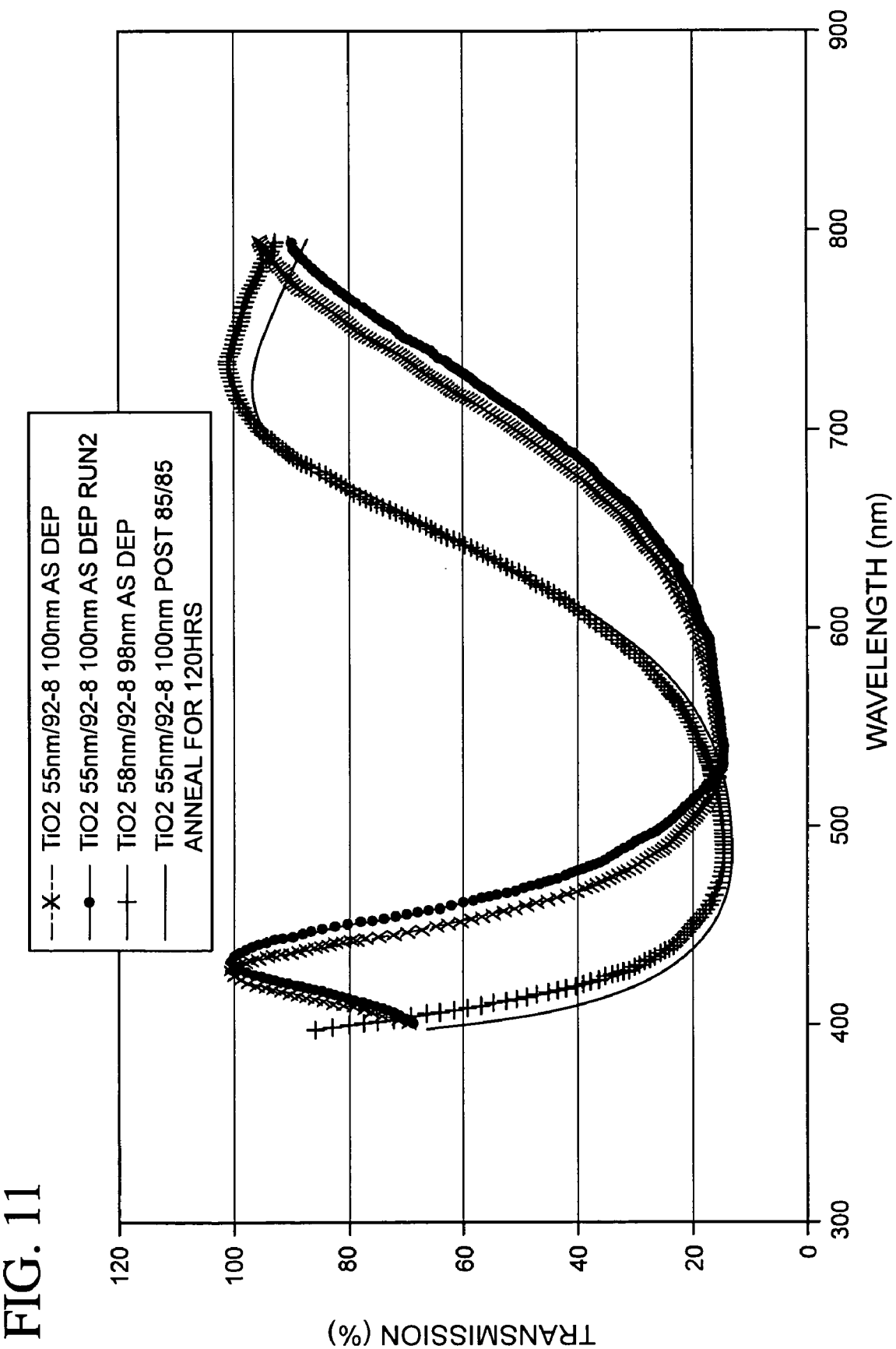
FIG. 11 shows transmission versus wavelength curves for various examples of dielectric stacks of barrier layers according to embodiments of the present invention.

FIG. 11 illustrates the transmission data collected from examples of dielectric stacks according to the present invention. The metrology equipment utilized in taking the data resulting in FIG. 11 was a Perkin Elmer Lambda-6 Spectrophotometer. Four samples were measured and each were 5 layer stacks of $TiO_2$/92-8 as described above. Two samples have the same thickness layers (55 nm $TiO_2$ and 100 nm 92-8). As illustrated in FIG. 11, the two different runs have almost the same transmission spectrum demonstrating the repeatability of the deposition process. The third example had a different thickness arranged so as to shift the transmission spectrum towards the blue. The fourth example was generated after the third example was maintained under 85/85 (85 C 85% humidity) test conditions for 120 hours. It can be observed that the humidity and heat did not have a significant impact on the transmission characteristics of the mirror stack, again demonstrating the functionality of such dielectric stacks as protection layers as well as optical layers (i.e., no measurable wet-shift). A similar result was obtained after 500 hours of test with the 85/85 conditions with no measurable wet-shift.

Figure 6:
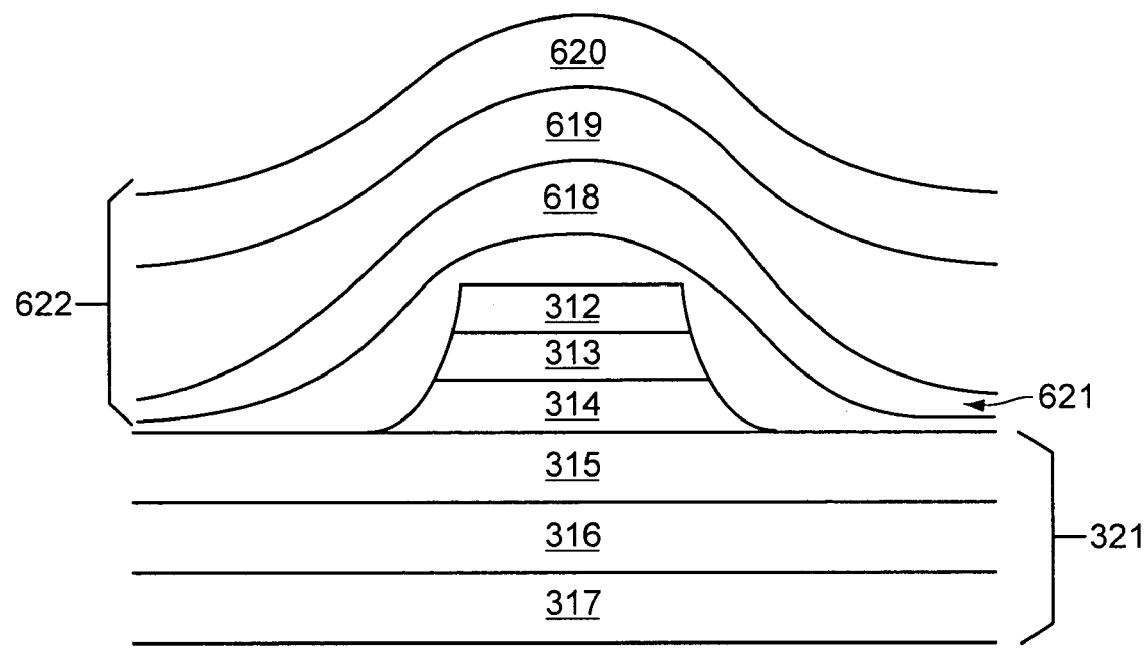
FIG. 6 shows an example of a microcavity enhanced LED structure similar to that shown in FIG. 3 further protected by a dielectric stack of barrier layers according to embodiments of the present invention.

FIG. 6 shows an example of another structure 633 with a microcavity enhanced LED structure 321 as described with FIG. 3 covered and protected by a structure 622 such as those shown in FIGS. 2A through 2F. In structure 321, as shown in FIG. 6, layers 314, 313, and 312 have been patterned. A structure 622 with dielectric stacks 618 and 620 deposited on opposite sides of a substrate 619 can be formed separately. Dielectric stacks 618 and 619 are formed as described with dielectric stacks 120 of FIGS. 2A through 2F. Structure 622 can then be epoxied over structure 321 in order to seal and protect structure 321. Epoxy layer 621, for example, can be an EVA epoxy.

Figure 7:
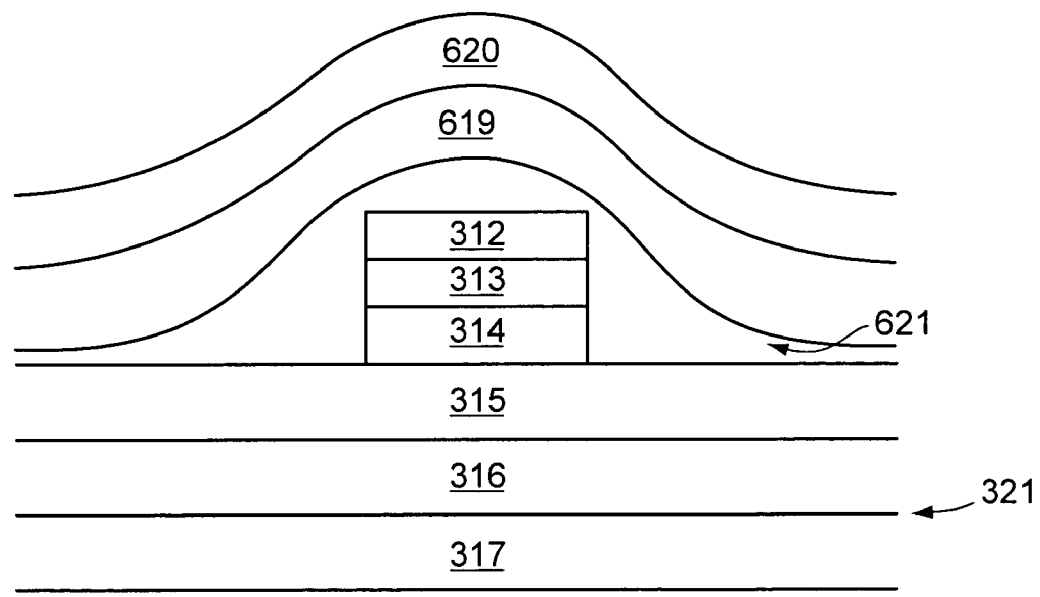
FIG. 7 shows another example of a microcavity enhanced LED structure similar to that shown in FIG. 3 further protected by a dielectric stack of barrier layers according to embodiments of the present invention.

FIG. 7 shows another structure 700 with an example of a microcavity enhanced LED structure 321 as described with FIG. 3 covered and protected by a structure 623 such as those shown in FIGS. 2A through 2F. Covering structure 623 includes substrate 619, with dielectric stack 620 deposited on substrate 619, epoxied to device 321.

Figure 4:
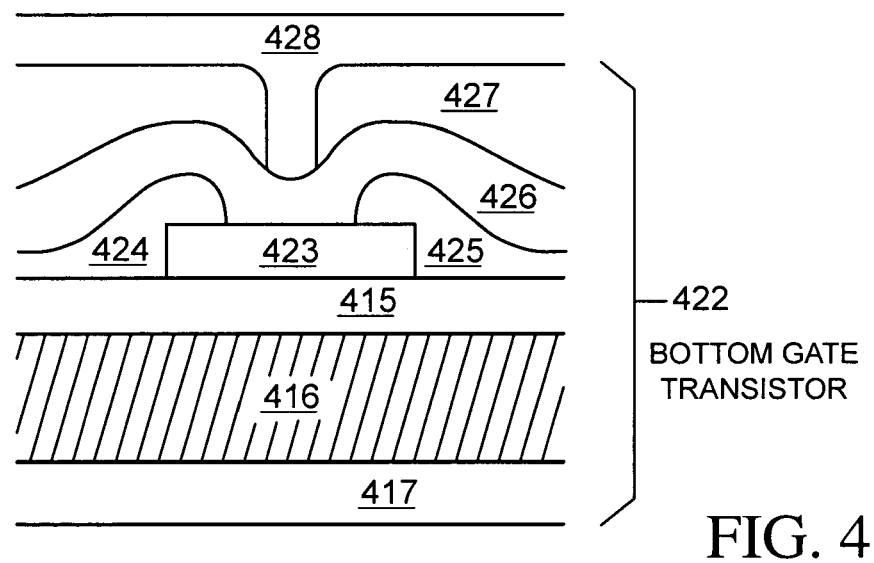
FIG. 4 shows a bottom gate transistor device with a dielectric stack of barrier layers according to-embodiments of the present invention.

FIG. 4 illustrates another example of barrier layers according to the present invention that also function as electrical layers (i.e., layers with electrical function such as providing resistance or function as the dielectric in a capacitor structure). The structure shown in FIG. 4 illustrates an example of a bottom gate transistor structure 422 according to the present invention. Transistor structure 422 is formed on a substrate 416, which may be a plastic or glass material. In the embodiment illustrated in FIG. 4, a dielectric stack 415 according to the present invention is deposited on a top surface of substrate 116 and a second dielectric stack 417 according to the present invention is deposited on a bottom surface of substrate 116. Dielectric stacks 417 and 415 each can include layers of high index and low index dielectric materials, as discussed above. The high index and low index dielectric materials, for example $TiO_2$ and silica/alumina layers as described above, each have low-voltage flat bands and low surface defects and therefore are suitable for use as thin film transistor structures. A semiconductor layer 423 is deposited on barrier stack 415 and patterned. Semiconductor layer 423 can be a semiconductor such as silicon, germanium, or may be of zinc oxide or a polymer material. Layers 424 and 425 form source and drain layers in contact with semiconductor layer 423. Layer 426 can be formed of a material with a high dielectric constant, such as any of the dielectric layers forming dielectric stacks 415 and 417, for example the high-dielectric strength $TiO_2$ material deposited by the processes described here. Layer 427 is an inter layer and layer 428 is the gate metal.

Figure 5:
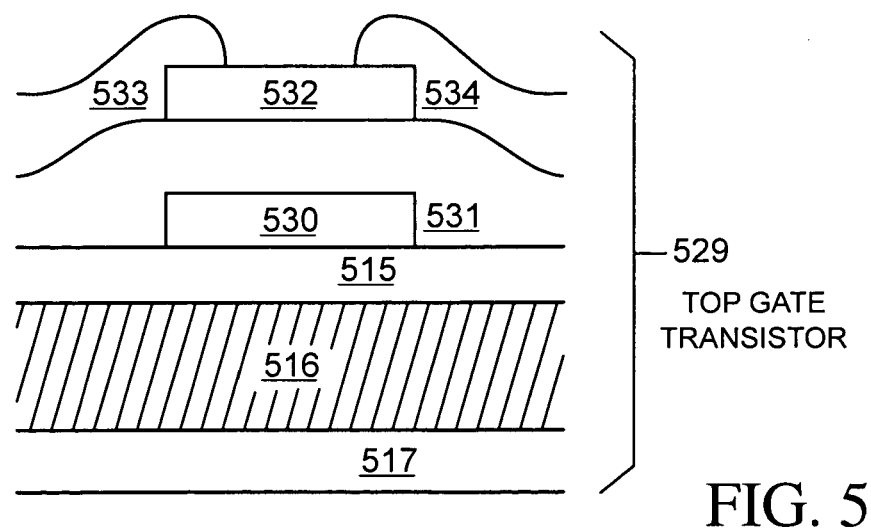
FIG. 5 shows a top gate transistor device with a dielectric stack of barrier layers according to embodiments of the present invention.

FIG. 5 shows an example of a top gate transistor device 529. Transistor device 529 is formed on a substrate 516 that is protected from atmospheric contamination (for example water or gasses) and physical wear and abrasion by dielectric stacks 515 and 517. Dielectric stacks 515 and 517 are formed from one or more layers of optical material as discussed above with dielectric stack 120. Gate layer 530 is deposited on dielectric stack 515. Layer 530 may be a metallic layer such as aluminum or chrome. A gate oxide layer 531 is deposited over layer 530. A semiconductor layer 532 is deposited on gate oxide layer 531 over layer 530. Semiconducting layer 532 can be similar to layer 423 of FIG. 4. Layers 533 and 534 are source and drain layers, respectively, and are similar to layers 424 and 428 of device 422 of FIG. 4 and may be formed from a conducting metal, conducting oxide, or a conducting polymer, for example.

Dielectric stacks with barrier layers according to the present invention can have atomically smooth film surfaces, independent of the film thickness. Additionally, dielectric stacks with barrier layers according to the present invention can have film transparencies that are unmeasurably different from zero. These dielectric stacks represent a new capability for biased barrier film defect levels and barrier protection. Few products requiring dielectric barrier protection from water and oxygen, such as OLED displays, can tolerate a defect every square centimeter. Some embodiments of barrier layers as 2.5 nanometers and as thick as 15 microns have been deposited that exhibit an average surface roughness of about 0.2 nm, indicating a damage free process. Such layers exhibit an optical quality surface for all film thicknesses deposited, representative of the high amorphous film uniformity attainable with these processes that produce embodiments of the barrier layer according to the present invention.

Dielectric barrier layers according to the present invention have been shown to protect ultra thin reactive metal films of aluminum from steam heat oxidation from 125 to 250° C. at pressures of 3.5 ATM of pure steam for hundreds of hours with no visible defect on 100 mm silicon wafers. Consequently, it is clear that both titanium oxide and alumina/silicate barrier layers, as described herein, can provide long term protection of reactive films which are pin hole free up to the area of one or both wafers. One pin hole in the protective dielectric barrier on a 100 mm wafer, with an area of approximately 75 square centimeters, would translate into a pin hole density of about 0.0133 per square centimeter. As shown in FIGS. 8 and 9, there were two wafers, one with aluminosilicate and one with titania barrier dielectric coatings, that were failure free. The total area between the two wafers was 150 square centimeters. If there were 1 defect on these two wafers the defect density would be 0.00666 per square centimeter. However, since the wafers were free of defects, the actual defect density could not be measured from the results of only two wafers. As indicated, then, the actual defect density was less than 0.0133 per square centimeter and likely less than 0.007 per square centimeter.

In some embodiments of the invention, a soft metal, such as indium or indium-tin, breath treatment can be performed before deposition of one or more barrier layers such as those discussed above. It is likely that the soft metal breath treatment can be utilized to release stress between the dielectric barrier layer and the substrate. Further, the soft metal breath treatment can act to nucleate for further growth of pin-hole free or defect-free barrier layer films on the substrate.

FIGS. 12A and 12B show a single barrier layer structure 1200 with deposited on a substrate 1201 with and without a soft-metal breath treatment according to the present invention. In FIG. 12A, a barrier layer 1203 such as is described above is deposited directly on substrate 1201. Substrate 1201 can be any suitable substrate material, including glass, plastic, or Si Wafers, for example. Substrate 1201 can, for example, include an OLED structure or other optically active structure which requires high optical throughput or an electrical structure that may utilize the barrier layers as electrical layers. Barrier layer 1203 can be any one or more barrier layers as is described above. As illustrated in FIG. 12A, barrier layer 1203 can develop stress-related surface roughness during deposition and use.

FIG. 12B illustrates the results of depositing barrier layer 1203 following a soft-metal breath treatment according to some embodiments of the present invention. As is shown in FIG. 12B, the stress is apparently relieved resulting in a barrier layer with much better surface smoothness.

A soft-metal breath treatment according to some embodiments of the present invention includes an exposure of the substrate for a short time to a soft metal vapor followed by a heat treatment. An indium-tin breath treatment, for example, involves exposure of the substrate to indium-tin from an indium-tin target in a pulsed-dc process and a subsequent heat treatment. Direct exposure to indium-tin-oxide vapor does not yield the particular beneficial results illustrated below. Without being bound by a particular theory that may be presented in this disclosure, an In/Sn breath treatment can relieve stress in the deposited barrier layer, improving surface smoothness and MOCON WVTR performance.

In a particular example of formation of barrier layer structure 1200, an embodiment of a soft-metal breath treatment was performed on a plastic substrate 1201. A breath treatment of Indium/Tin, for example, can be performed from an Indium Tin (90%/10%) Target. The process for performing the indium/tin breath treatment can be designated as 750 W/0 W/200 KHz/20Ar/0O2/10 sec. In other words, the pulsed-dc, biased, wide target PVD process is operated with a 90% Indium/10% Tin target, an Ar flow of 20 sccms running at a constant power of 750 W in a pulsed PVD system 10 (FIG. 1A) (Pulsing Frequency 200 KHz, Reverse time 2.2 μsec) for 10 secs in the AKT 1600 PVD system using the Pinnacle Plus PDC power supply. Then, the breath treatment continued and substrate 1201 was transferred into a load lock of an AKT 4300 Tool and the Tool was pumped to a base pressure of less than about $1\times10^{-5}$ Torr. The substrate was then transferred to a Heat Chamber at 130° C. at $1\times10^{-8}$ Torr where it is thermally treated at 130° C. for about 25 min.

Substrate 1201 (with the indium/tin breath treatment described above) was then moved to a second chamber where barrier layer 1203 is deposited. Barrier layer 1203 can be formed, as indicated above, from a 92-8 Alumino-Silicate (92% Si/8% Al) target with the deposition performed at room temperature.

The process parameters for the deposition of the embodiment of 92-8 barrier layer 1203 can be 3 KW/200 W/200 KHz/85Ar/90O2/x. Therefore, the process is performed with about 3 KW PDC power, about 200 KHz Pulsing Frequency, and about 2.2 microseconds reverse time. Bias power can be held at about 200 W. A Gas flow of about 85 sccms of Ar and about 90 sccms of $O_2$ was utilized. In deposition of this particular embodiment, the deposition process was power cycled where the on cycle was about 180 secs long and the off cycle was about 600 secs long for 9 cycles. The thickness of the resulting barrier layer 1203 was then about 1600 Å. In a particular test, the process described above was utilized for deposition of a barrier structure 1200 with substrate 1201 being three plastic sheets of size 6 inch by 6 inch (Dupont Teijin PEN films 200 μm thick, referred to as a PEN substrate). In general, any barrier layer (e.g., the 92-8 or $TiO_2$ layers discussed above) can be deposited following a soft-metal breath treatment. As discussed before, examples of processes for embodiments of barrier layers according to the present invention are presented here but wide ranges of process parameters can result in barrier layers according to the present invention.

Barrier layer structure 1200 on substrate 1201 can then be tested using a variety of techniques, some of which are described below. In particular, the stress in layer 1203 can be measured using a Flexus Stress Measurement technique. Surface roughness can be measured utilizing an atomic force microscope (AFM), and water vapor transmission rates (WVTR) can be measured in a high pressure, high humidity pressure cooker device.

Figure 13:
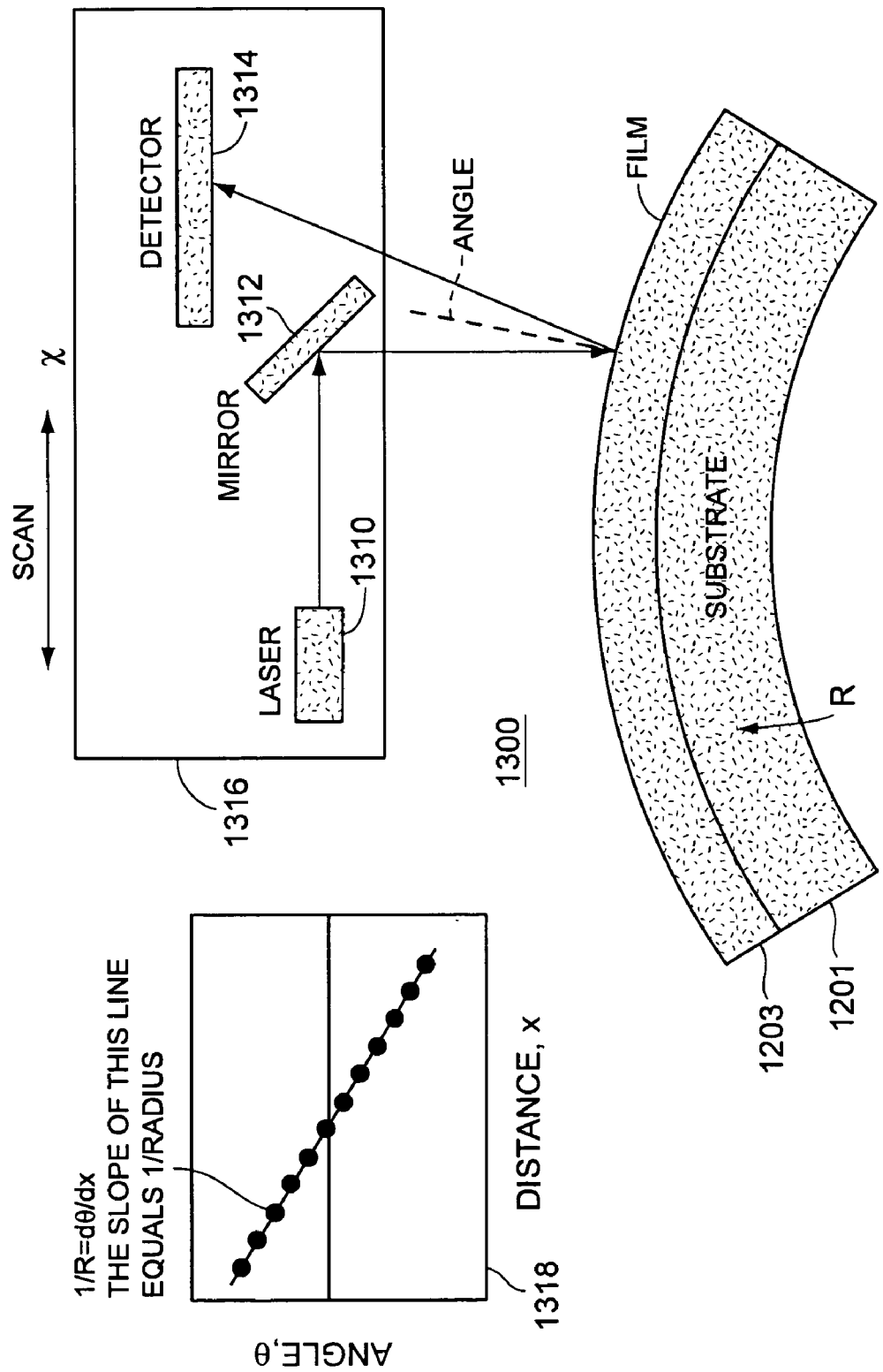
FIG. 13 shows a Flexus Stress Measurement apparatus that can be utilized to test barrier layers.

FIG. 13 illustrates a Flexus Scanning Assembly 1300 that can be utilized to test barrier layer-structure 1200. In Flexus Scanning Assembly 1300, a light beam for laser 1310 is directed onto the upper surface of barrier layer 1203 by a mirror 1312. The reflected light beam from barrier layer 1203 is detected by detector 1314. Detector 1314 measures the deflection of the light beam from the beam reflected by mirror 1312. The optical section 1316, which can include laser 1310, mirror 1312, and detector 1314, can be scanned across substrate 1201 and the angle of deflection θ, which is related to the radius of curvature of substrate 1201 as shown in relation 1318.

The thin film stress in barrier 1203 can be calculated utilizing the changes in substrate deformation measured by Flexus apparatus 1300 as optical portion 1316 is scanned. As is shown in relationship 1318, the angle of the reflected beam can be monitored during the scan and the inverse of the radius of curvature R of substrate 1201 can be calculated from the derivative of the angle as a function of position in the scan.

In some cases, Flexus apparatus 1300 can utilize a dual wavelength technology to increase the range of film types that the tool is capable of measuring. Each Flexus apparatus 1300, then, can have more than one laser 1310 available for scanning the wafer since different film types will reflect different wavelengths of light. Further, the reflected laser intensity provides a good indication of the quality of the measurement. In general, low light intensity at detector 1314 indicates a poor measurement condition.

Figure 14:
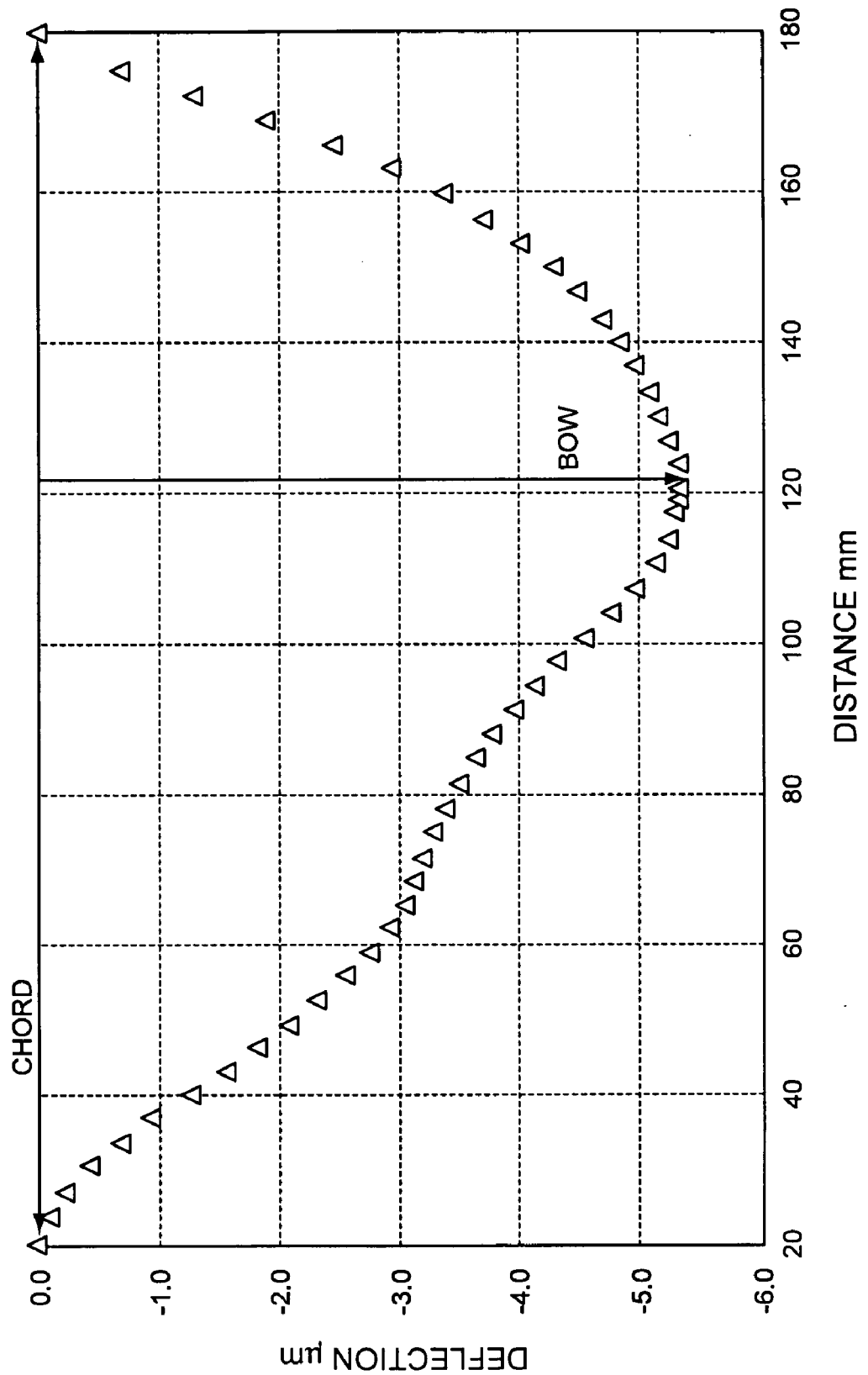
FIG. 14 illustrates a measurement of the wafer bow using the Flexus Stress Measurement apparatus illustrated in FIG. 13.

In Flexus apparatus 1300, stress can be determined using Stoney's equation. In particular, stress in layer 1203 can be determined by measurements of the radius of curvature before deposition of layer 1203 and the radius of curvature after deposition of layer 1203. In particular, according to Stoney's equation, the stress can be given by $$\sigma = \frac{E_s}{(1-v_s)} \frac{t_s^2}{6t_f} \left( \frac{1}{R_s} - \frac{1}{R_f} \right),$$

where $E_s/(1-v_s)$ is the biaxial modulus of substrate 1201, σ is the stress of substrate 1201, $t_s$ is the substrate thickness, $t_f$ is the film thickness, $R_s$ is the pre-deposition radius of curvature, and $R_f$ is the post deposition radius of curvature. To obtain the best results, both measurements of the radius of curvature should be performed on the same tool to minimize systematic error in the measured radius. In addition, because the shape of a wafer is unique and because stress is calculated based on the change in deformation of the substrate, each wafer should have a baseline radius measurement. A positive radius indicates tensile stress and a negative radius indicates compressive stress. Wafer bow can be calculated, as shown in FIG. 14, by measuring the maximum point of deflection from the chord connecting the end-points of a scan of Flux apparatus 1300.

Measurements of stress performed on several embodiments of barrier films 1203 where barrier film 1203 is a 92-8 film as discussed above with and without a nucleation layer 1202 formed by a soft-metal breath treatment is tabulated in Table 2. As shown in Table 2, sample 1 was a 1.5 KÅ 92-8 film of actual thickness 1760 Å deposited on a Si-Wafer substrate. The resulting stress at about room temperature was −446.2 MPa. Sample 2 was a 1.5 KÅ 92-8 film of actual thickness 1670 Å over an Al-breath deposition resulted in a stress of about −460.2 MPa. In sample 3, a 1.5 KÅ 92-8 film of thickness 1860 Å was deposited subsequent to a In-breath deposition and resulted in a stress of −330.2 MPa, nearly 100 MPa lower than either of the other two depositions depicted.

Figure 15:
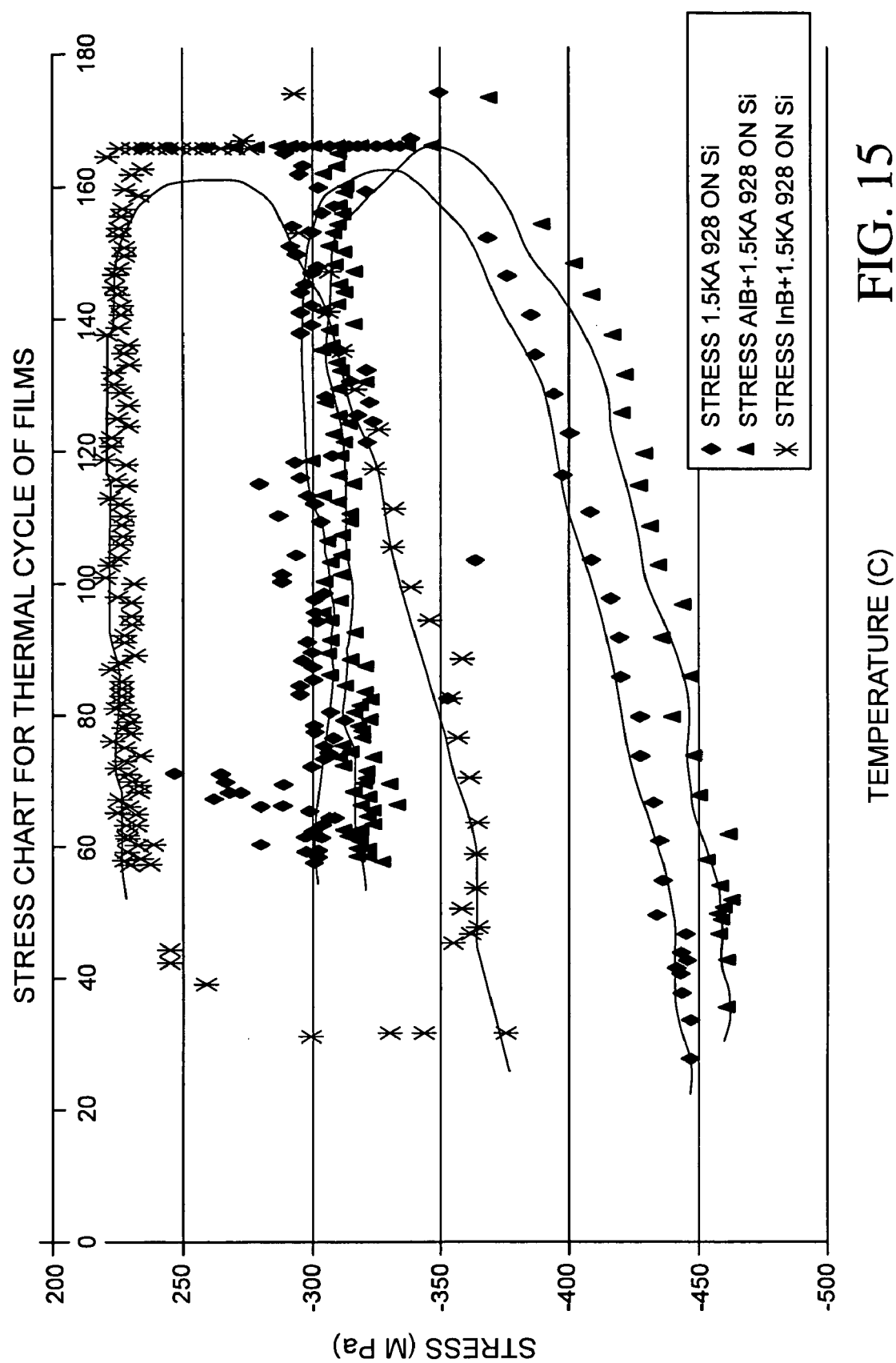
FIG. 15 illustrates the stress in various deposited barrier layers according to embodiments of the present invention as a function of temperature through a single temperature cycle after deposition.

FIG. 15 shows the compiled data for several deposition of sample 1, sample 2, and sample 3 as shown in Table 1 over a temperature cycle. The temperature cycle included heating from room temperature to about 160° C. and cooling back to room temperature. In a Si-Wafer substrate, the radius of the wafer is assumed not to change with temperature. Stress data in each case was taken at the temperature indicated. As can be seen from FIG. 15, 92-8 films deposited over an In-breath treatment exhibited much less stress than did either a 92-8 film deposited over an Al-breath treatment or a 92-8 film deposited over the substrate without a soft-metal breath treatment.

Atomic-force microscopy (AFM) can be utilized to measure surface roughness of a film. In AFM, a miniature probe is physically scanned over the surface of a film such that the probe is in contact, and follows the surface, of the film. The probe has a small tip and therefore is capable of accurately monitoring the surface roughness for features on the order of a few nanometers.

Figure 16A:
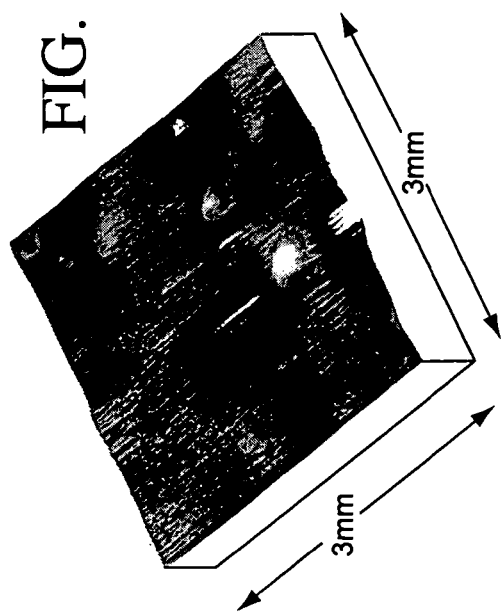
FIGS. 16A, 16B, 16C, and 16D show atomic force microscopy measurements of surface roughness for some barrier layer films according to embodiments of the present invention.
Figure 16B:
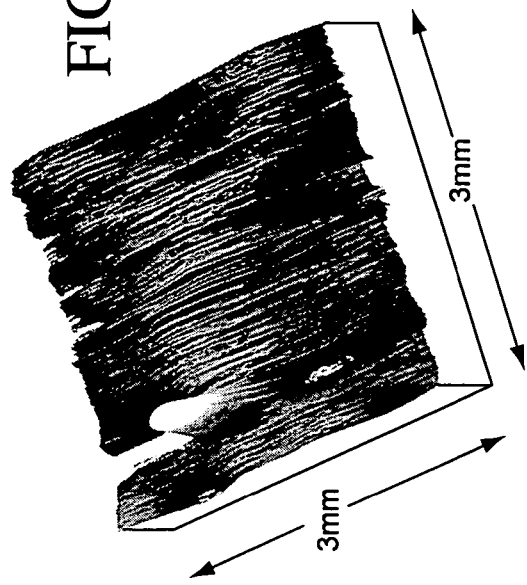
Figure 16C:
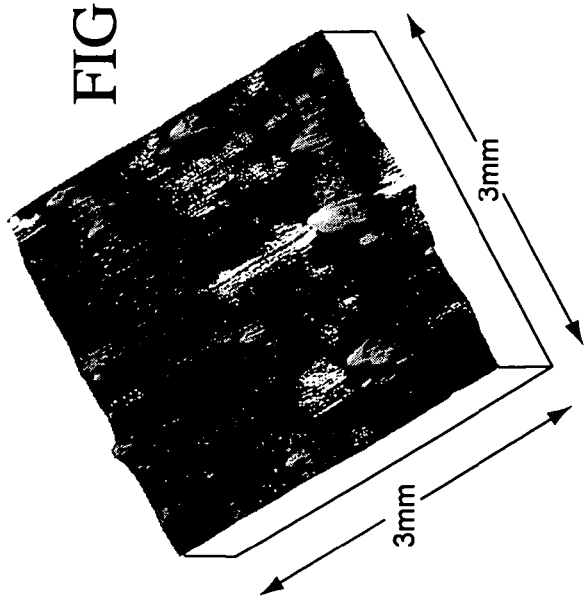
Figure 16D:
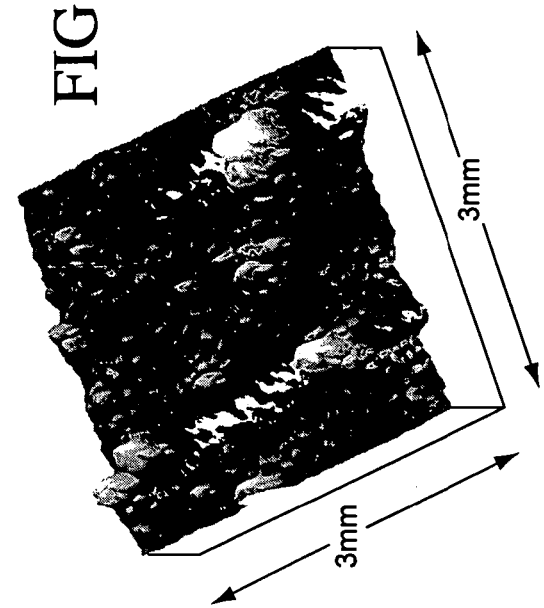

FIG. 16A shows the surface roughness of a PEN substrate (Dupont Teijin PEN films 200 μm thickness), before deposition of a barrier layer according to the present invention. As is shown in FIG. 16A, a PEN substrate typically has a surface roughness of average 2.2 nm, root-mean-square average RMS of 3.6 nm, and a typical maximum roughness of about 41.0 nm. As shown in FIG. 16B, deposition of a 1.5 KÅ 92-8 after an indium-tin breath treatment on a PEN substrate results in an average surface roughness of 1.0 nm with RMS roughness of 1.7 nm and maximum roughness of 23.6 nm. As is shown in FIG. 16C, an indium-tin-oxide (ITO) breath treatment was performed before the 1.5 KÅ 92-8 barrier layer film deposition resulted in an average roughness of 2.1 nm with RMS roughness of 3.4 nm and maximum roughness of 55.4 nm. The deposition shown in FIG. 16C is performed with a 125 μm PEN substrate rather than a 200 μm PEN substrate. Therefore, a direct ITO treatment does not perform as well as treatment with an indium-tin breath. As shown in FIG. 16D, deposition of a barrier layer of 1.5 KÅ directly on a 125 μm PEN substrate resulted in a barrier layer with average surface roughness of about 5.2 nm with RMS roughness of 8.5 nm and maximum roughness of 76.0 nm. Therefore, although the ITO breath treatment was better than no soft-metal treatment at all with respect to surface roughness, an indium-tin breath treatment resulted in the best surface roughness yielding an average surface roughness of about 1.0 nm.

Figure 12:
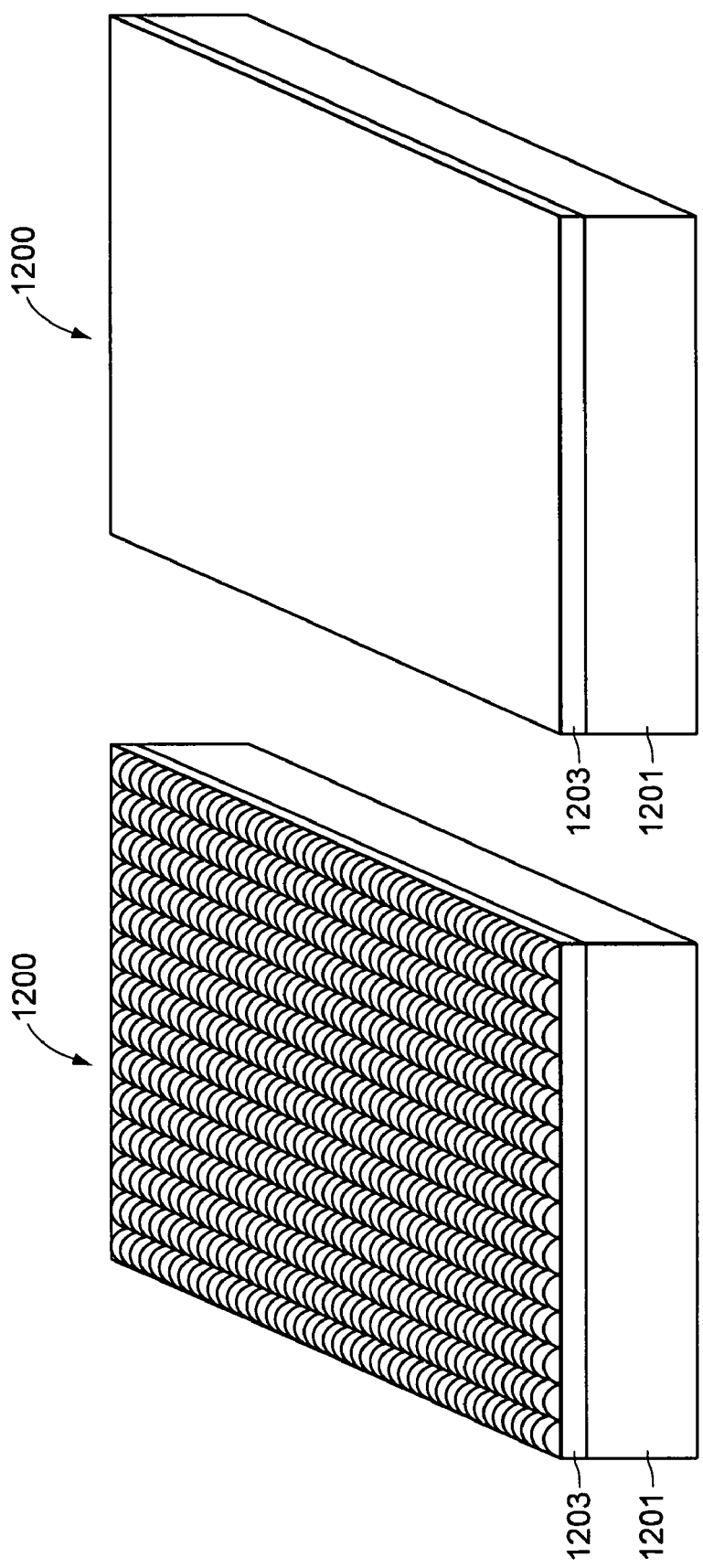
FIGS. 12A and 12B illustrate a single barrier layer structure deposited with and without a soft-metal breath treatment according to embodiments of the present invention.
Figure 17:
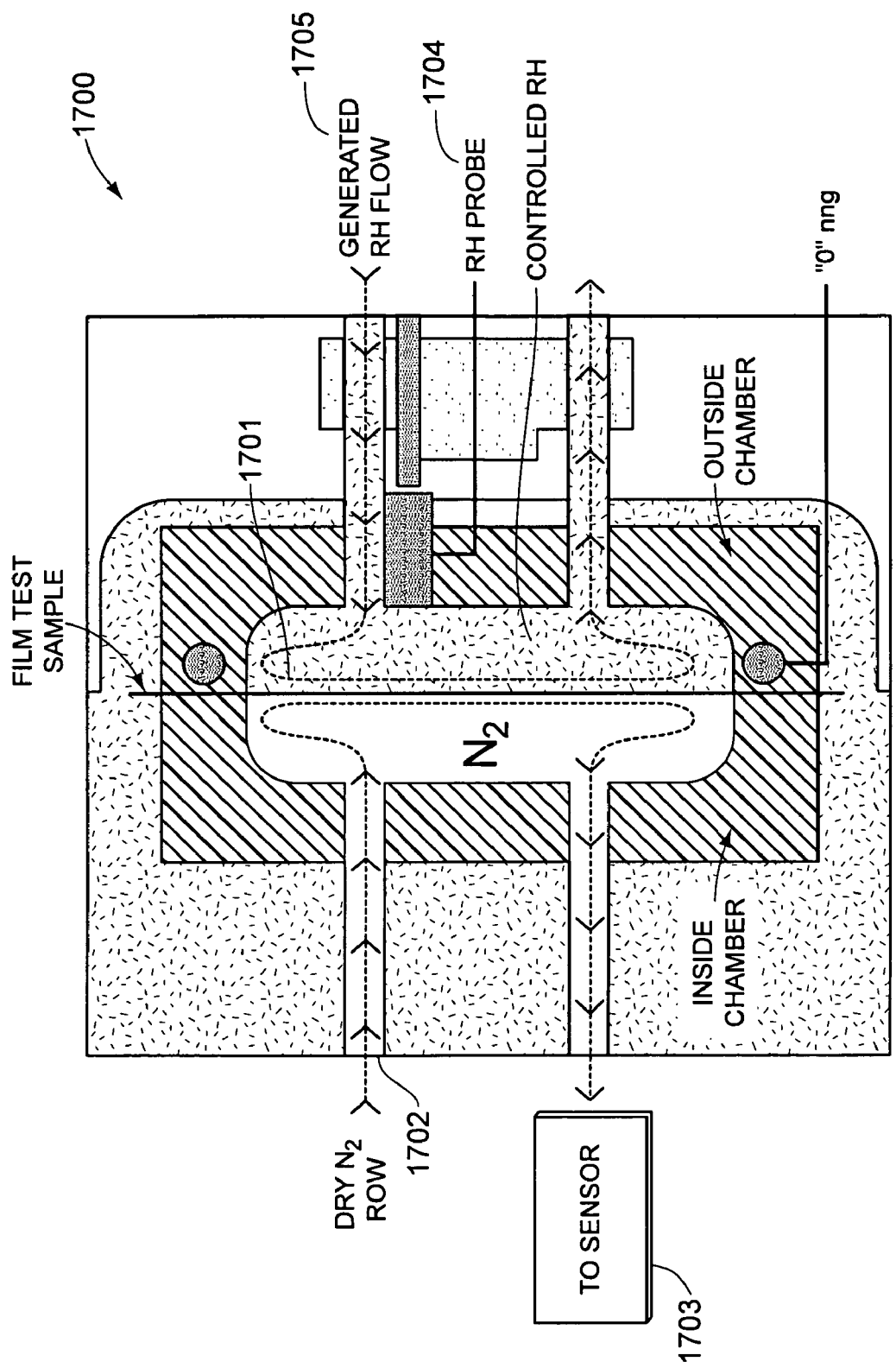
FIG. 17 illustrates a water vapor transmission test that can be utilized to characterize barrier layers deposited according to embodiments of the present invention.

FIG. 17 illustrates a water vapor transmission (WVTR) testing apparatus 1700 that can be utilized to characterize barrier layer films according to embodiments of the present invention. A sample 1701 can be mounted into apparatus 1700 in such a way that the surface of substrate 1201 (FIG. 12) is isolated from the surface of barrier layer 1203 (FIG. 12). A moisture-free gas is input to port 1702, contacts one surface of sample 1701, and is directed to sensor 1703 where the water vapor coming from sample 1701 is monitored. A humid gas is directed to the opposite side of sample 1701 through port 1705. An RH probe 1704 can be utilized to monitor the water content of the gas input to port 1705. Sensor 1703, then, monitors the water vapor that is transmitted through sample 1701.

Such tests are performed by Mocon Testing Service, 7500 Boone Avenue North, Minneapolis, Minn. 55428. In addition, the Mocon testing is pereformed in accordance with ASTM F1249 standards. Typically, instruments utilized for WVTR testing by Mocon can detect transmission in the range 0.00006 gm/100 in$^2$/day to 4 gm/100 in$^2$/day. The Mocon 3/31 instrument, for example, has a lower detection limit of about 0.0003 gm/100 in$^2$/day.

A barrier layer deposition formed with an Al-breath treatment followed by a 1.5 KÅ 92-8 barrier layer deposition on a 200 μm PEN substrate resulted in a Mocon test WVTR of 0.0631 gm/100in$^2$/day. A barrier layer deposition formed with an In-breath treatment followed by a 1.5 KÅ 92-8 on 200 μm PEN substrate resulting in no measurable WVTR in the Mocon 3/31 instrument (i.e., the transmission rate was less than 0.0003 gm/100 in$^2$/day).

As was further discussed above, FIGS. 16A through D illustrates the role that a soft-metal breath treatment (in particular an indium breath treatment) can play in determining the surface roughness of a deposited barrier layer according to the present invention. The surface roughness of a barrier layer can also affect the WVTR characteristics of a barrier layer. Smoother barrier layer result in better WVTR performance. As such, FIG. 16A shows a bare 200 μm PEN substrate with no barrier. FIG. 16B shows a 200 μm PEN substrate with a 1500 Å thickness 92-8 barrier layer deposited after a In/Sn breath treatment according to the present invention. FIG. 16C illustrates a 200 μm PEN substrate with a 1500 Å 92-8 barrier layer deposited after treatment with ITO breath. FIG. 16D is a 200 μm PEN substrate with a 1500 Å 92-8 barrier layer directly deposited on the substrate. As can be seen, the structure of FIG. 16B shows the best surface smoothness characteristics.

Table 3 illustrates several examples of barrier layers, with surface smoothness characteristics and MOCON WVTR testing results. In Table 3, the samples described in rows 1-4 are 92-8 layers (as described above) of thickness about 2000 Å deposited on one or both sides of a 700 μm thick polycarbonate (LEXAN produced by General Electric, corp.). The data shows that the double-side coated barrier layer structure (rows 1 and 2) perform about an order of magnitude better in MOCON WVTR test than does the one sided structures (rows 3 and 4).

Rows 5 through 8 illustrate various deposition a PEN substrate (with rows 5-6 describing deposition on a 200 μm PEN substrate and rows 7 and 8 describing depositions on a 125 μm PEN substrate). The In breath treatment parameters refer to In/Sn breath treatments as discussed above. The AFM parameters are shown in FIGS. 16B through 16D as described earlier. As discussed before, the best surface smoothness and the best WVTR characteristics are shown in row 6, with In breath treatment followed by deposition of a 92-8 layer. The data in row 9 indicates an In breath treatment (In/Sn) with higher power on a thinner (125 μm) PEN substrate. Presumably, the thermal stress behavior on a 125 μm PEN substrate is worse than that for a 200 μm PEN substrate. Further indication of this effect is shown in the data of rows 30 through 33 along with FIGS. 19A and 19B. The data in rows 30 and 31 include a indium/tin breath treatment (at 750 W) on a 200 μm PEN substrate followed by about 1.5 kÅ 92-8 layer deposition, which yields a very smooth surface (e.g., about 1.1 nm average) as shown in FIG. 19A and an undetectable MOCON WVTR characteristic on the MOCON 3/31 test equipment. The data in rows 32 and 33, with In/Sn breath treatment followed by 1.5 kÅ 92-8 layer deposition on 125 μm PEN substrate, shows worse smoothness (about 2.0 nm average roughness) and a WVTR test in the MOCON apparatus of about $1.7 \times 10^{-2}$ gm/m²/day. The 92-8 depositions illustrated in rows 30 through 33 were concurrently performed in a single operation.

The data in rows 12 and 13 of Table 3 indicate an In-breath treatment plus 1.5 kÅ $TiO_2$ deposition on a 125 μm PEN substrate. Data in rows 10 and 11 indicate an In/Sn-breath treatment plus 1.5 kÅ 92-8 deposition on a 125 μm PEN substrate. As can be seen in Table 3, the WVTR characteristics of 92-8 layers is more than an order of magnitude better than the WVTR characteristics of $TiO_2$ layers. Representative smoothness for rows 12 and 13 are presented in FIG. 22A and representative smoothness for rows 10 and 11 are presented in FIG. 22B. As is shown in Table 3, the average smoothness for 92-8 layers is approximately an order of magnitude better than the average smoothness for $TiO_2$.

The data in rows 14 and 15 of Table 3 illustrate an I/Sn breath treatment on a 125 μm LEXAN substrate followed by a 92-8 layer deposition. The data in rows 14 and 15 can be compared with the data in rows 32 and 33, which are In/Sn breath treatment on a 125 μm PEN substrate followed by a 1.5 KÅ 92-8 layer deposition. The smoothness is comparable between the LEXAN and PEN substrate, although as can be seen in a comparison of FIGS. 21A and 21B, the morphology is different, i.e. barrier layers according to the present invention deposited on the LEXAN substrate show more granularity than barrier layers deposited on the PEN substrate.

The data in rows 16 through 18 of Table 3 illustrate different process parameters for an In/Sn breath treatment followed by 1.5 KÅ 92-8 deposition on a 200 μm PEN substrate. The data in row 16 illustrates a setting where the current is set rather than power. The data in row 16 is taken with a current of 6.15 amps. In the barrier layer illustrated in row 17, the In/Sn breath treatment is performed at 1.5 kW of operating power. In the barrier layer illustrated in row 18, the In/Sn breath treatment is performed at 750 W of operating power. In each case, the MOCON WVTR characteristic of the resulting barrier layer is below detectability on the MOCON 3/31 instrument.

Figure 18B:
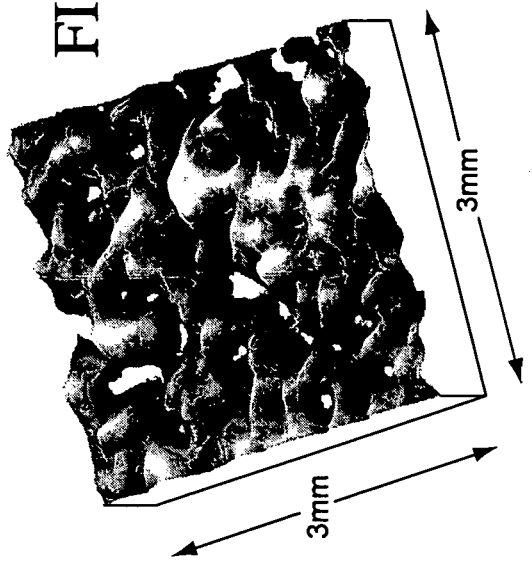
FIGS. 18A through 18D illustrate the effects of different In/Sn breath treatment parameters on the surface roughness of the deposited barrier layer according to the present invention.

The data in rows 19-29 of Table 3 illustrate different I/Sn breath treatments and their effects on the surface smoothness of the resulting barrier layers and on the MOCON WVTR characteristics. The data in rows 19-22 are all examples of where the In/Sn breath treatment is replaced with a evaporated In layer followed by a 130 C preheat treatment. The surface roughness characteristics are illustrated in FIG. 18A and shows an average roughness of about 1.1 nm. However, the morphology is very granular as is shown in FIG. 18A, with presumably a lot of porosity, resulting in MOCON WVTR test on the order of 0.8 gm/m²/day. The data shown in row 23 of Table 3 illustrates the case where no In/Sn breath treatment is utilized and the 200 μm PEN substrate is preheated before deposition of a 1.5 kÅ 92-8 deposition, which as shown in FIG. 18C has a surface roughness of about 5.2 nm average and a MOCON WVTR of about 0.8 gm/m²/day, or the same as is shown with the indium evaporation vapor data shown in rows 19-22. Therefore, the same characteristics result whether an indium evaporation vapor treatment is applied or not.

Rows 24-29 of Table 3 illustrate data where an In/Sn breath treatment was performed at 280° C. rather than at room temperature. The surface roughness, as is illustrated in FIG. 18B, was about 1.1 nm average. However, the MOCON WVTR data was about $3 \times 10^{-2}$ gm/m²/day. This value is much higher than that shown in the similar depositions of rows 30 and 31, which were below $5 \times 10^{-3}$ gm/m²/day detectability limits of the MOCON 3/31 instrument.

The data in rows 34 and 35 illustrates deposition of a 1.5 kÅ 35-65 layer (i.e., a deposition with a target having 35% Si and 65% Al) following a In/Sn deposition on a 200 μm PEN substrate. As is illustrated, the MOCON WVTR are $1.4 \times 10^{-1}$ gm/m²/day, which shows the possible necessity of a biased process for producing barrier layers according to the present invention.

FIG. 20 illustrates a barrier layer 2002 that can also operate as a thin film gate oxide deposited on a substrate 2001. A thin film gate oxide 2002 can be deposited as a barrier layer according to the present invention. Such a layer as the benefit of protecting moisture and oxygen sensitive transistor layer compounds of germanium, tin oxide, zinc oxide, or pentacene, for example, while functioning as the thin oxide electrical layer. Substrate 2001 can include any electrical device that can be formed on, for example, a silicon wafer, plastic sheet, glass plate, or other material. Barrier layer 2002 can be a thin layer, for example from 25 to 500Å.

Titanium oxide is well known as the preferred material for biological implantation due to the lack of immunological response to titanium oxide. In addition, it is preferred that a thin film of $TiO_2$, which is an inmmunologically indifferent barrier layer, can simultaneously protect a device such as a voltage or charge sensor or an optical device such as a waveguide while performing the role of coupling the device capacitively or optically due to its' high dielectric constant or its' high optical index.

An array of capacitors can be coupled by the high capacitive density due to the proximity of the sensor provided by a very thin high-k dielectric such as $TiO_2$. In practice, a micron or sub micron array can be used to monitor the electrical activity, amplitude, and direction of very low electrical signals such as those that accompany the propagation of electrical signals in single axion of single neural ganglia. Conversely, it can also be used to electrically couple stimulus to adjacent cells or tissue. High resolution, high-capacitance coupling to the optic nerve, the auditory nerve, or neural tissue on the order of 5 to 50 femto-farads/μm² is made uniquely feasible by such a capacitive barrier film without immunological reaction.

Other embodiments of the invention will be apparent to those skilled in the art from consideration of the specification and practice of the invention disclosed herein. This disclosure is not limited by any theories or hypothesis of operation that are utilized to explain any results presented. It is intended that the specification and examples be considered as exemplary only, with a true scope and spirit of the invention being indicated by the following claims. As such, this application is limited only by the following claims.

TABLE 1

| Stack # | Substrates | Stack layer composition | TiO2 Deposition Process | Measured Thickness TiO2 (Å) | Silica/alumina (92-8) Deposition Process | Measured Thickness Silica/Alumina (92-8) (Å) |
|---|---|---|---|---|---|---|
| 1 | 6 Microscope slides + 1 6 inch wfr | TiO2/92-8/ TiO2/92-8/ TiO2 | 7 KW/200 W/200 KHz/60Ar/ 9002/950 s | 580 | 3 KW/200 W/200 KHz/85Ar/ 9002/1005 | 980 |
| 2 | 6 Microscope slides + 1 6 inch wfr | TiO2/92-8/ TiO2/92-8/ TiO2 | 7 KW/200 W/200 KHz/60Ar/ 9002/835 s | 510 | 3 KW/200 W/200 KHz/85Ar/ 9002/1006 | 910 |
| 3 | 2 Sodalime Glass + 4 Microscope Slides | TiO2/92-8/ TiO2/92-8/ TiO2 | 7 KW/200 W/200 KHz/60Ar/ 9002/901 s | 550 | 3 KW/200 W/200 KHz/85Ar/ 9002/1025 | 1000 |
| 4 | 2 Sodalime Glass + 4 Microscope Slides | TiO2/92-8/ TiO2/92-8/ TiO2 | 7 KW/200 W/200 KHz/60Ar/ 9002/901 s | 550 | 3 KW/200 W/200 KHz/85Ar/ 9002/1025 | 1000 |
| 5 | 4 Microscope Slides | TiO2/92-8/ TiO2/92-8 | 7 KW/200 W/200 KHz/60Ar/ 9002/901 s | 550 | 3 KW/200 W/200 KHz/85Ar/ 9002/1025 | 1000 |
| 6 | 3 Sodalime Glass + 4 Microscope Slides | TiO2/92-8/ TiO2/92-8/ TiO2 | 7 KW/200 W/200 KHz/60Ar/ 9002/901 s | 550 | 3 KW/200 W/200 KHz/85Ar/ 9002/1025 | 1000 |

TABLE 2

| Id | Comment | Temp ° C. | Radius (m) | Stress Mpa | Film Thickness (Å) | Bow (μm) |
|---|---|---|---|---|---|---|
| Sample 1 | pre-deposition | 21 | −4.76E+03 | N/A | N/A | 1.58 |
| | 1.5 KÅ 92-8 film deposition/no In-breath treatment | 27 | −145.978 | −446.2 | 1760 | 11.74 |
| Sample 2 | pre-deposition | 29 | −4.10E+03 | N/A | N/A | 1.38 |
| | Al breath deposition then 1.5 KÅ 92-8 film treatment | 36 | −169.482 | −460.2 | 1670 | 10.18 |
| Sample 3 | pre-deposition | 25 | −230.249 | N/A | N/A | 4.36 |
| | In breath treatment then 1.5 KÅ 92-8 film deposition | 25 | −67.169 | −330.2 | 1860 | 10.25 |

TABLE 3

| Sample ID | Sample Description | Substrate Material | Thickness μm | MOCON WVTR (g/100 inch2/day) | MOCON WVTR (g/m2/day) | AFM Results |
|---|---|---|---|---|---|---|
| 1 (Film (coated on both sides) - A) | 2 KÅ 92-8 on Polycarbonate, deposited on both sides-A | LEXAN | 700 | 7.2000E−04 | 1.1160E−02 | |
| 2 (Film (coated on both sides) - B) | 2 KÅ 92-8 on Polycarbonate, deposited on both sides-B | LEXAN | 700 | 5.8000E−04 | 8.9900E−03 | |
| 3 (Film (coated on one side) - A) | 2 KÅ 92-8 on Polycarbonate - A | LEXAN | 700 | 8.3000E−03 | 1.2865E−01 | |
| 4 (Film (coated on one side) - B) | 2 KÅ 928 on Polycarbonate - B | LEXAN | 700 | 1.7200E−02 | 2.6660E−01 | |
| 5 (Al + 1.5K928) | Al -breath (500 W 10 sec + 130 c heat treatment) + 1.5 KÅ 92-8 on PEN | PEN Q65 | 200 | 6.3100E−02 | 9.7805E−01 | |
| 6 (InB + 1.5K928) | In Breath (750 W 5 sec + 130 c heat treatment) + 1.5 KÅ 92-8 on PEN | PEN Q65 | 200 | 3.0000E−04 | 4.6500E−03 | Ra = 1.3 nm RMS = 1.5 nm Rmax = 9.8 nm See FIG. 16B |
| 7 (102- MOCON ID: 1619-003) | NO In Breath + 130 c Preheat + 1.5 KÅ 92-8 on PEN | PEN Q65 | 125 | 4.0200E−02 | 6.2310E−01 | Ra = 5.2 nm RMS = 8.5 nm Rmax = 76.0 nm See FIG. 16D |
| 8 (103- MOCON ID: | ITO breath + 130 c Preheat + 1.5 KÅ | PEN Q65 | 125 | 2.4900E−02 | 3.8595E−01 | Ra = 2.1 nm RMS = 3.4 nm |

TABLE 3-continued

Figure 21A:
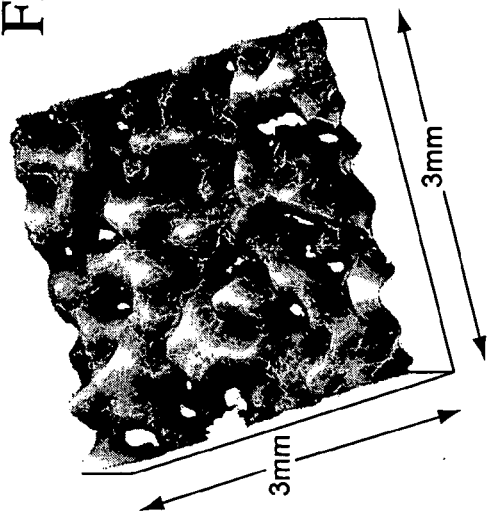
FIGS. 21A and 21B illustrate the effect of substrate composition on the surface roughness of a deposited barrier layer according to the present invention.
Figure 22A:
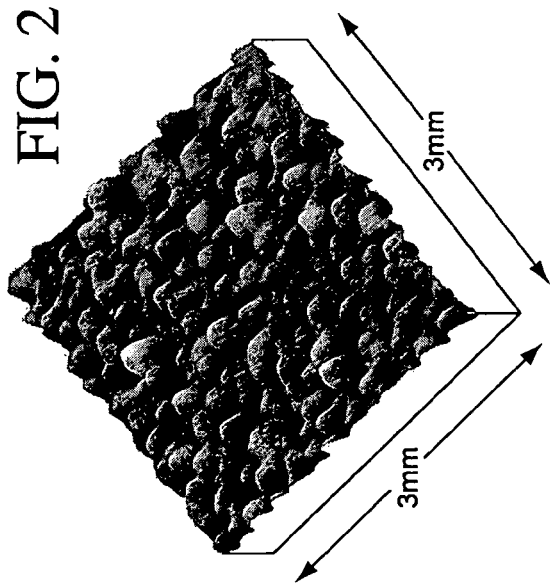
FIGS. 22A and 22B illustrate that the character of the barrier layer deposition according to embodiments of the present invention effect surface roughness.
Figure 22B:
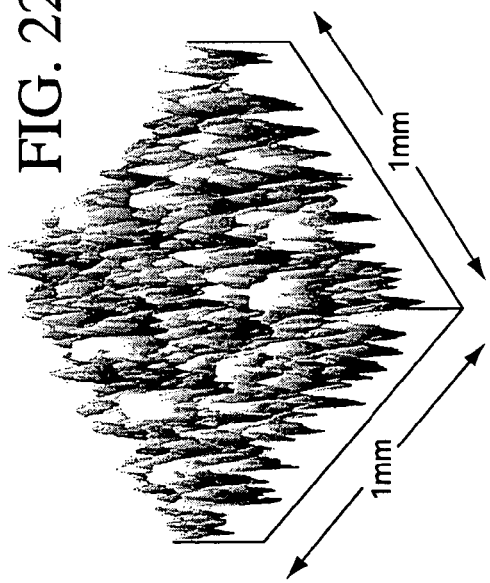

| Sample ID | Sample Description | Substrate Material | Thickness μm | MOCON WVTR (g/100 inch2/day) | MOCON WVTR (g/m2/day) | AFM Results |
|---|---|---|---|---|---|---|
| 1619-002) | 92-8 on PEN | | | | | Rmax = 55.5 nm See FIG. 16C |
| 9 (104-MOCON ID: 1619-001) | In Breath (1.5 KW + 130 c Preheat) + 1.5 KÅ 92-8 on PEN | PEN Q65 | 125 | 2.5900E−02 | 4.0145E−01 | |
| 10 (PEN-A) | In Breath + 92-8 on PEN | PEN Q65 | 125 | 1.8323E−03 | 2.8400E−02 | Ra = 3.4 nm, RMS = 4.2 nm Rmax = 29.4 nm See FIG. 22B |
| 11 (PEN-B) | In Breath + 92-8 on PEN | PEN Q65 | 125 | 2.3871E−03 | 3.7000E−02 | Ra = 3.4 nm, RMS = 4.2 nm Rmax = 29.4 nm See FIG. 22B |
| 12 (PEN2-A) | In Breath + TiO2 on PEN | PEN Q65 | 125 | 1.0065E−01 | 1.56 | Ra = 7.7 nm, RMS = 9.7 nm Rmax = 72.4 nm See FIG. 22A |
| 13 (PEN2-B) | In Breath + TiO2 on PEN | PEN Q65 | 125 | 8.9032E−02 | 1.38 | Ra = 7.7 nm, RMS = 9.7 nm Rmax = 72.4 nm See FIG. 22A |
| 14 (LEXAN-A) | InB + 92-8 on LEXAN | LEXAN | 125 | 1.4194E−02 | 2.2000E−01 | Ra = 0.9 nm, RMS = 1.1 nm Rmax = 9.5 nm See FIG. 21A |
| 15 (LEXAN-B) | In Breath + 92-8 on LEXAN | LEXAN | 125 | 2.8387E−03 | 4.4000E−02 | Ra = 0.9 nm, RMS = 1.1 nm Rmax = 9.5 nm See FIG. 21A |
| 16 (6.15 A) | In Breath (6.15 A 5 sec + 130° C. heat) + 1.5 KÅ 92-8 on PEN | PEN Q65 Lot#1 | 200 | Below Detection | Below Detection | |
| 17 (1.5 KW) | In Breath (1.5 KW 5 sec + 130° C. heat) + 1.5 KÅ 92-8 on PEN | PEN Q65 Lot#1 | 200 | Below Detection | Below Detection | |
| 18 (750 W) | In Breath (750 W 5 sec + 130° C. heat) + 1.5 KÅ 92-8 on PEN | PEN Q65 Lot#1 | 200 | Below Detection | Below Detection | |
| 19 (.037-A) | In Breath from Evap 0.037 + 130° C. Preheat + 1.5 KÅ 92-8 on PEN | PEN Q65 Lot#1 | 200 | 5.1097E−02 | 7.9200E−01 | Ra = 1.1 nm RMS = 1.4 nm Rmax = 9.4 nm See FIG. 18A |
| 20 (.037-B) | In Breath from Evap 0.037 + 130° C. Preheat + 1.5 KÅ 92-8 on PEN | PEN Q65 Lot#1 | 200 | 3.9935E−02 | 6.1900E−01 | Ra = 1.1 nm RMS = 1.4 nm Rmax = 9.4 nm See FIG. 18A |
| 21 (.113-A) | In Breath from Evap 0.113 + 130° C. Preheat + 1.5 KÅ 92-8 on PEN | PEN Q65 Lot#1 | 200 | 5.6323E−02 | 8.7300E−01 | Ra = 1.1 nm RMS = 1.4 nm Rmax = 9.4 nm See FIG. 18A |
| 22 (.113-B) | In Breath from Evap 0.113 + 130° C. Preheat + 1.5 KÅ 92-8 on PEN | PEN Q65 Lot#1 | 200 | 4.1097E−02 | 6.3700E−01 | Ra = 1.1 nm RMS = 1.4 nm Rmax = 9.4 nm See FIG. 18A |
| 23 (MON-A) | NO In Breath + 130° C. heat + 1.5 KÅ 92-8 on PEN | PEN Q65 Lot#1 | 200 | 4.9806E−02 | 7.7200E−01 | Ra = 5.2 nm RMS = 8.5 nm Rmax = 76.0 nm See FIG. 18C |
| 24 (12-17-03-01-A) | In Breath @280 c + 130° C. heat + 1.5 KÅ 92-8 on PEN | PEN Q65 Lot#1 | 200 | 7.8710E−04 | 1.2200E−02 | Ra = 1.1 nm, RMS = 1.4 nm Rmax = 9.4 nm See FIG. 18B |
| 25 (12-17-03-01-B) | In Breath @280 c + 130° C. heat + 1.5 KÅ 92-8 on PEN | PEN Q65 Lot#1 | 200 | 1.1484E−03 | 1.7800E−02 | Ra = 1.1 nm RMS = 1.4 nm Rmax = 9.4 nm See FIG. 18B |
| 26 (12-17-03-03-A) | In Breath @280 c + 130° C. heat + 1.5 KÅ 92-8 on PEN | PEN Q65 Lot#1 | 200 | 1.9548E−03 | 3.0300E−02 | Ra = 1.1 nm RMS = 1.4 nm Rmax = 9.4 nm See FIG. 18B |
| 27 (12-17-03-03-B) | In Breath @280 c + 130° C. heat + 1.5 KÅ 92-8 on PEN | PEN Q65 Lot#1 | 200 | 1.1935E−03 | 1.8500E−02 | Ra = 1.1 nm RMS = 1.4 nm Rmax = 9.4 nm See FIG. 18B |
| 28 (12-17-03- | In Breath @280 c + 130° C. | PEN Q65 | 200 | 2.2065E−03 | 3.4200E−02 | Ra = 1.1 nm |

TABLE 3-continued

Figure 18D:
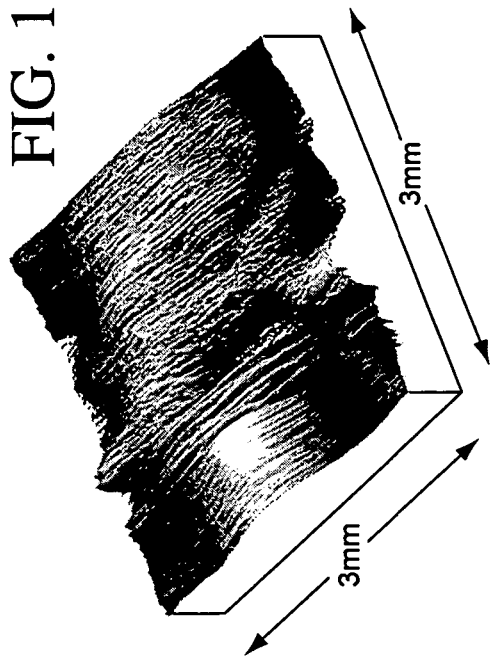
Figure 18A:
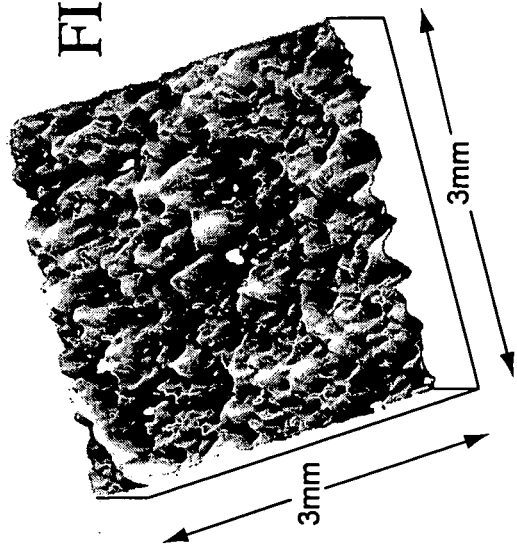
Figure 18C:
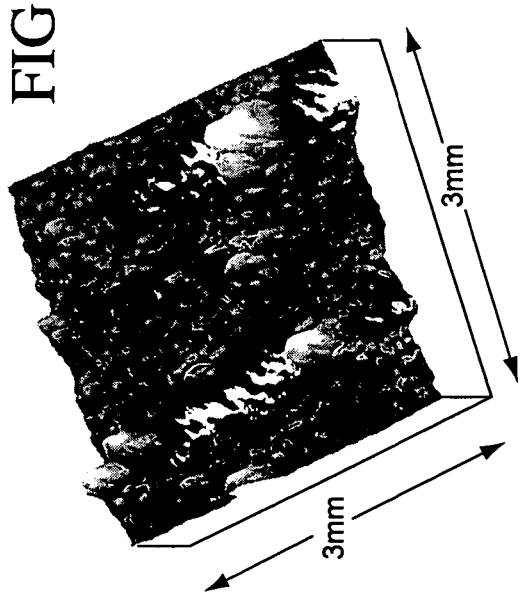
Figure 21B:
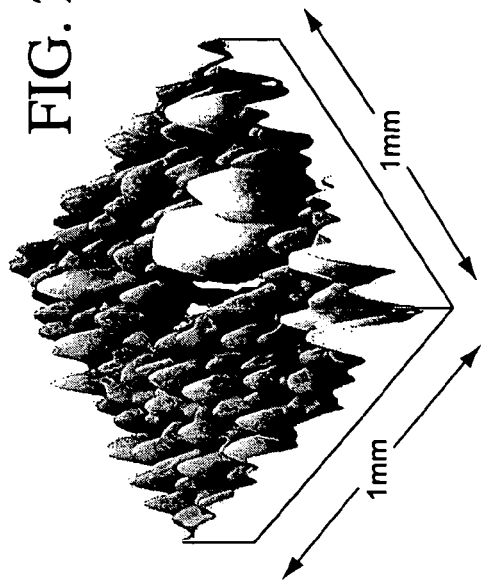

| Sample ID | Sample Description | Substrate Material | Thickness μm | MOCON WVTR (g/100 inch2/day) | MOCON WVTR (g/m2/day) | AFM Results |
|---|---|---|---|---|---|---|
| 02_A) | heat + 1.5 KÅ 92-8 on PEN | Lot#1 | | | | RMS = 1.4 nm Rmax = 9.4 nm See FIG. 18B |
| 29 (12-17-03-02_B) | In Breath @280 c + 130° C. heat + 1.5 KÅ 92-8 on Pen | PEN Q65 Lot#1 | 200 | 2.7677E−03 | 4.2900E−02 | Ra = 1.1 nm RMS = 1.4 nm Rmax = 9.4 nm See FIG. 18B |
| 30 (165-A) | InB 750 W 5 sec + 4300 130 c Preheat + 1.5 KA 92-8 on PEN | PEN Q65 Lot#2 | 200 | Below Detection | Below Detection | Ra = 1.1 nm RMS = 1.4 nm Rmax = 9.4 nm See FIG. 19A and 18D |
| 31 (165-B) | In Breath (750 W 5 sec + 130° C. heat) + 1.5 KÅ 92-8 on PEN | PEN Q65 Lot#2 | 200 | Below Detection | Below Detection | Ra = 1.1 nm RMS = 1.4 nm Rmax = 9.4 nm See FIG. 19A and 18D |
| 32 (167-A) | In Breath (750 W 5 sec + 130° C. heat) + 1.5 KÅ 92-8 on PEN | PEN Q65 Lot#2 | 125 | 9.0323E−04 | 1.4000E−2 | Ra = 2.0 nm RMS = 2.6 nm Rmax = 18.0 nm See FIG. 19B and 21B |
| 33 (167-B) | In Breath (750 W 5 sec + 130° C. heat) + 1.5 KÅ 92-8 on PEN | PEN Q65 Lot#2 | 125 | 1.4194E−03 | 2.2000E−02 | Ra = 2.0 nm RMS = 2.6 nm Rmax = 18.0 nm See FIG. 19B and 21B |
| 34 (170-A) | In Breath (750 W 5 sec + 130° C. heat) + 1.5 KÅ 35-65 (no bias) on PEN | PEN Q65 Lot#2 | 125 | 8.7442E−03 | 1.3600E−01 | |
| 35 (170-B) | In Breath (750 W 5 sec + 130° C. heat) + 1.5 KÅ 35-65 (no Bias) on PEN | PEN Q65 Lot#2 | 125 | 2.6258E−02 | 4.0700E−01 | |

TABLE 4

| | Hv [Vickers] | H [MPa] | E [GPa] | □ d [□m] |
|---|---|---|---|---|
| MN-Al2O3 5 mN | 1 836 | 19 814 | 211.49 | 0.129 |
| MN-Al2O3 2.5 mN | 2 087 | 22 520 | 230.51 | 0.084 |
| Y10822-1 5 mN | 753 | 8 123 | 104.03 | 0.194 |
| 808-0Y10822-1 2.5 mN | 834 | 8 996 | 104.29 | 0.130 |

What is claimed:

1. A method of forming a barrier layer, comprising:
providing a substrate;
depositing a highly densified, amorphous, dielectric material over the substrate in a pulsed-DC, biased, wide target physical vapor deposition process; and
performing a soft metal breath treatment on the substrate.

2. The method of claim 1, wherein the dielectric material is formed from a target comprising 92% Al and 8% Si.

3. The method of claim 1, wherein the dielectric material is formed from a target comprising of Titanium.

4. The method of claim 1, wherein the dielectric material is formed from a target material comprising materials chosen from a group consisting of Mg, Ta, Ti, Al, Y, Zr, Si, Hf, Ba, Sr, Nb, and combinations thereof.

5. The method of claim 1, wherein the soft-metal breath treatment is an indium/tin breath treatment.

6. The method of claim 1, wherein the barrier layer is also an optical layer.

7. The method of claim 1, wherein the barrier layer has a permeable defect concentration of less than about 1 per square centimeter.

8. The method of claim 1, wherein the barrier layer includes a $TiO_2$ layer.

9. The method of claim 1, wherein the barrier layer is also an electrical layer.

10. The method of claim 9, wherein the barrier layer includes a capacitive layer.

11. The method of claim 10, wherein the capacitive layer is at least one of a $TiO_2$ layer and an Alumina/silica layer.

12. The method of claim 9, wherein the barrier layer includes a resistive layer.

13. The method of claim 12, wherein the resistive layer is indium-tin metal or oxide.

14. The method of claim 1, wherein the barrier layer includes a tribological layer.

15. The method of claim 14, wherein the tribological layer is at least one of a $TiO_2$ layer and an Alumina/silica layer.

16. The method of claim 1, wherein the barrier layer is a biologically immune compatible layer.

17. The method of claim 16, wherein the biologically immune compatible layer is $TiO_2$.

18. The method of claim 1, wherein a target utilized to form the barrier layer is formed from metallic magnesium.

19. The method of claim 1, wherein a target material utilized to form the barrier layer comprises materials chosen from a group consisting of Mg, Ta, Ti, Al, Y, Zr, Si, Hf, Ba, Sr, Nb, and combinations thereof.

20. The method of claim 19, wherein the target material includes a concentration of rare earth metal.

21. The method of claim 1, wherein a target material utilized to form the barrier layer comprises a sub-oxide of a group consisting of Mg, Ta, Ti, Al, Y, Zr, Si, Hf, Ba, Sr, Nb, and combinations thereof.

22. The method of claim 1, wherein an optical attenuation through the barrier layer is less than about 0.1 dB/cm in a continuous film.

23. The method of claim 1, wherein the barrier layer has a thickness less than about 500 nm.

24. The method of claim 1, wherein the barrier layer operates as a gate oxide for a thin film transistor.

* * * * *